United States Patent
Sills et al.

(10) Patent No.: US 9,842,839 B1
(45) Date of Patent: *Dec. 12, 2017

(54) MEMORY CELL, AN ARRAY OF MEMORY CELLS INDIVIDUALLY COMPRISING A CAPACITOR AND A TRANSISTOR WITH THE ARRAY COMPRISING ROWS OF ACCESS LINES AND COLUMNS OF DIGIT LINES, A 2T-1C MEMORY CELL, AND METHODS OF FORMING AN ARRAY OF CAPACITORS AND ACCESS TRANSISTORS THERE-ABOVE

(71) Applicant: Micron Technology, Inc., Boise, ID (US)

(72) Inventors: Scott E. Sills, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/404,995

(22) Filed: Jan. 12, 2017

(51) Int. Cl.
*H01L 21/00* (2006.01)
*H01L 27/108* (2006.01)
(Continued)

(52) U.S. Cl.
CPC .... *H01L 27/1082* (2013.01); *H01L 21/31111* (2013.01); *H01L 21/31144* (2013.01);
(Continued)

(58) Field of Classification Search
CPC ........... H01L 27/1082; H01L 21/31111; H01L 21/31144; H01L 27/108; H01L 27/10858;
(Continued)

(56) References Cited

U.S. PATENT DOCUMENTS 6,720,609 B2   4/2004   Deboer
9,324,730 B2   4/2016   Nam
(Continued)

OTHER PUBLICATIONS

U.S. Appl. No. 15/340,838, filed Nov. 1, 2016, Ramaswamy.
(Continued)

*Primary Examiner* — Nicholas Tobergte
(74) *Attorney, Agent, or Firm* — Wells St. John P.S.

(57) ABSTRACT

A method of forming an array of capacitors and access transistors there-above comprises forming access transistor trenches partially into insulative material. The trenches individually comprise longitudinally-spaced masked portions and longitudinally-spaced openings in the trenches longitudinally between the masked portions. The trench openings have walls therein extending longitudinally in and along the individual trench openings against laterally-opposing sides of the trenches. At least some of the insulative material that is under the trench openings is removed through bases of the trench openings between the walls and the masked portions to form individual capacitor openings in the insulative material that is lower than the walls. Individual capacitors are formed in the individual capacitor openings. A line of access transistors is formed in the individual trenches. The line of access transistors electrically couples to the individual capacitors that are along that line. Other aspects, including structure independent of method, are disclosed.

76 Claims, 35 Drawing Sheets

(51) Int. Cl.
*H01L 21/311* (2006.01)
*H01L 29/10* (2006.01)
*H01L 29/66* (2006.01)
*H01L 29/08* (2006.01)
*H01L 29/78* (2006.01)
*H01L 27/11514* (2017.01)
*H01L 27/11507* (2017.01)
*H01L 49/02* (2006.01)

(52) U.S. Cl.
CPC ...... *H01L 27/108* (2013.01); *H01L 27/10858* (2013.01); *H01L 27/10873* (2013.01); *H01L 27/11507* (2013.01); *H01L 27/11514* (2013.01); *H01L 28/60* (2013.01); *H01L 29/0847* (2013.01); *H01L 29/1033* (2013.01); *H01L 29/66666* (2013.01); *H01L 29/7827* (2013.01)

(58) Field of Classification Search
CPC ......... H01L 27/10873; H01L 27/11507; H01L 27/11514; H01L 28/60; H01L 29/0847; H01L 29/1033; H01L 29/66666; H01L 29/7827
See application file for complete search history.

(56) References Cited

U.S. PATENT DOCUMENTS

| | | | |
|---|---|---|---|
| 9,613,981 B2 | 4/2017 | Huo | |
| 2004/0164313 A1* | 8/2004 | Tews | H01L 27/10867 257/100 |
| 2004/0180547 A1* | 9/2004 | Beintner | H01L 29/945 438/694 |
| 2006/0043450 A1* | 3/2006 | Tang | H01L 21/28132 257/302 |
| 2006/0110884 A1* | 5/2006 | Wang | G11C 11/404 438/270 |
| 2007/0057301 A1* | 3/2007 | Wang | H01L 21/28114 257/296 |
| 2012/0104491 A1 | 5/2012 | Heineck et al. | |
| 2012/0214285 A1* | 8/2012 | Guha | H01L 29/66666 438/270 |
| 2013/0235642 A1 | 9/2013 | Heineck et al. | |
| 2014/0054677 A1 | 2/2014 | Hu et al. | |
| 2014/0054678 A1 | 2/2014 | Hu et al. | |
| 2014/0054718 A1 | 2/2014 | Karda et al. | |
| 2014/0231914 A1* | 8/2014 | Chang | H01L 29/66795 257/347 |
| 2015/0041873 A1 | 2/2015 | Karda et al. | |
| 2015/0140781 A1 | 5/2015 | Karda et al. | |
| 2015/0200202 A1 | 7/2015 | Karda et al. | |
| 2015/0318285 A1 | 11/2015 | Zhang | |
| 2015/0318296 A1 | 11/2015 | Kim | |
| 2016/0204122 A1 | 7/2016 | Shoji | |
| 2016/0276365 A1* | 9/2016 | Choi | H01L 27/11582 |

OTHER PUBLICATIONS

U.S. Appl. No. 15/340,842, filed Nov. 1, 2016, Ramaswamy.
U.S. Appl. No. 15/401,372, filed Jan. 9, 2017, Ramaswamy.
U.S. Appl. No. 15/402,463, filed Jan. 10, 2017, Ramaswamy.
U.S. Appl. No. 15/402,679, filed Jan. 10, 2017, Chavan et al.
U.S. Appl. No. 15/404,995, filed Jan. 12, 2017, Sills et al.

* cited by examiner

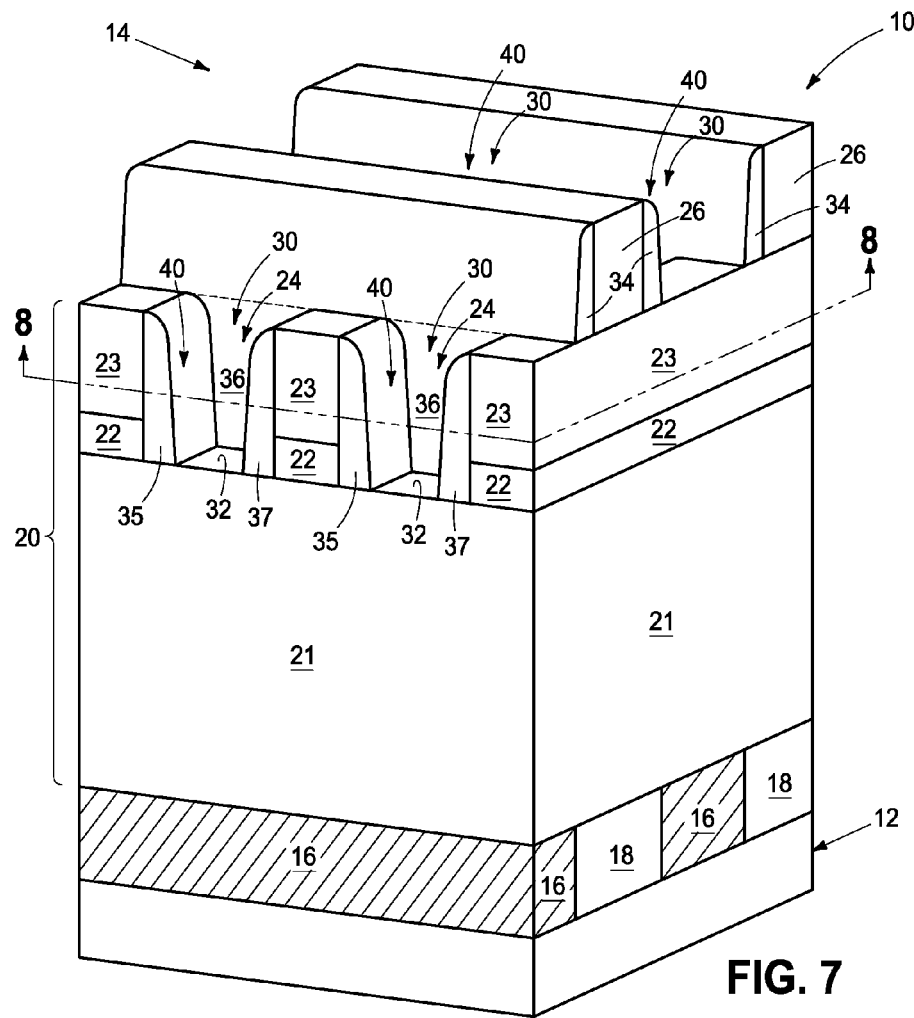
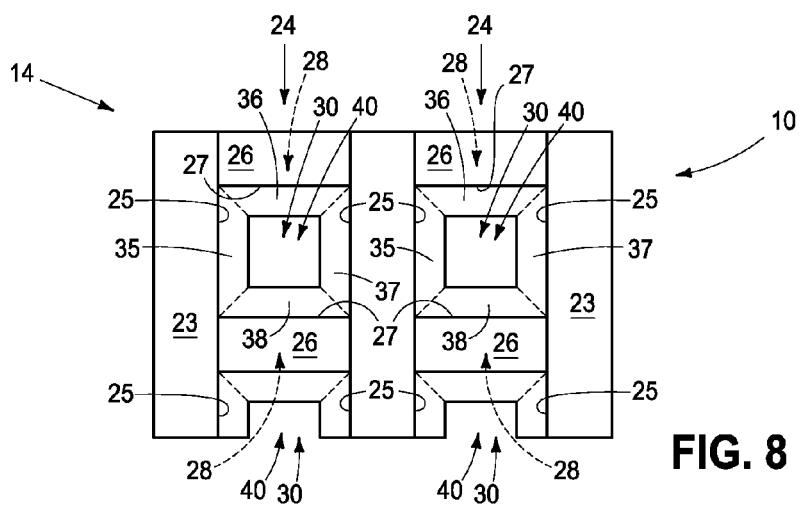

MEMORY CELL, AN ARRAY OF MEMORY CELLS INDIVIDUALLY COMPRISING A CAPACITOR AND A TRANSISTOR WITH THE ARRAY COMPRISING ROWS OF ACCESS LINES AND COLUMNS OF DIGIT LINES, A 2T-1C MEMORY CELL, AND METHODS OF FORMING AN ARRAY OF CAPACITORS AND ACCESS TRANSISTORS THERE-ABOVE

TECHNICAL FIELD

Embodiments disclosed herein pertain to memory cells, to an array of memory cells individually comprising a capacitor and a transistor with the array comprising rows of access lines and columns of digit lines, to 2T-1C memory cells, and to methods of forming an array of capacitors and access transistors there-above.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

BRIEF DESCRIPTION OF THE DRAWINGS

FIG. 7 is a view of the FIG. 6 construction at a processing step subsequent to that shown by FIG. 6.

FIG. 8 is a cross-sectional view taken through line 8-8 in FIG. 7.

DETAILED DESCRIPTION OF EXAMPLE EMBODIMENTS

Embodiments of the invention encompass methods of forming an array of capacitors and access transistors there-above and such arrays independent of method of manufacture. Embodiments of the invention also encompass methods of forming a tier of an array of memory cells within an array area, with the memory cells individually comprising a capacitor and an elevationally-extending transistor there-above. Embodiments of the invention also encompass memory cells independent of method of manufacture. Further, embodiments of the invention also encompass an array of memory cells individually comprising a capacitor and a transistor independent of method of manufacture. Example embodiments of methods of forming an array of capacitors and access transistors there-above are initially described with reference to FIGS. 1-21.

Figure 1:
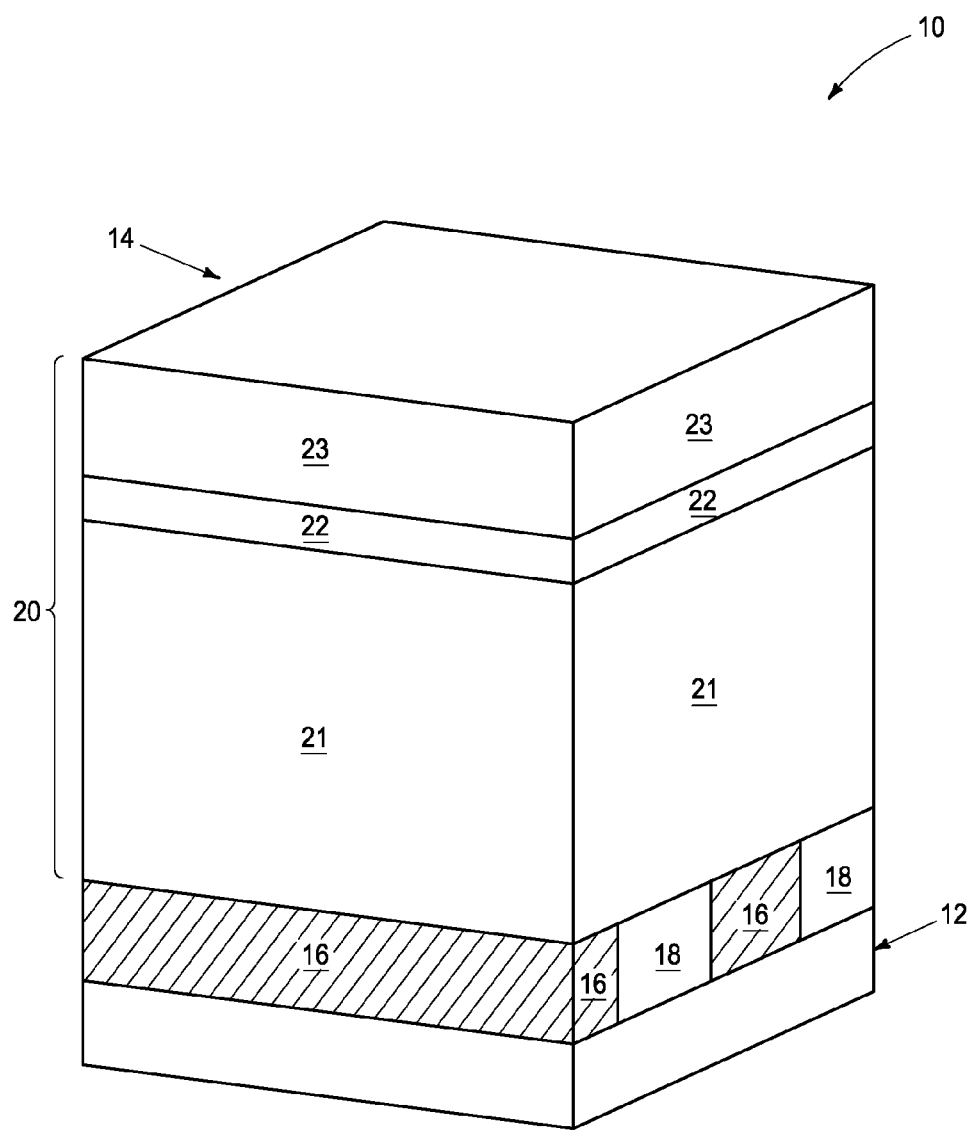
FIG. 1 is a perspective view of a substrate construction in process in accordance with an embodiment of the invention.

Referring to FIG. 1, such depicts a portion of a substrate fragment or construction 10 comprising a base substrate 12 having an array or array area 14 within which an array of memory cells individually comprising a transistor and a capacitor will be fabricated. An area (not shown) is peripheral to array 14 and may be fabricated to include circuit components (i.e., circuitry). Individual memory cells may be fabricated within array 14 and array 14 may comprise rows of access lines and columns of digit lines. Use of "rows" and "columns" herein is with respect to a series of access lines and a series of digit lines, respectively, and longitudinally along which individual memory cells have been or will be formed within array 14. The rows may be straight and/or curved and/or parallel and/or non-parallel relative one another, as may be the columns. Further, the rows and columns may intersect relative one another at 90° or at one or more other angles. The peripheral area may be considered as starting and array 14 may be considered as stopping where a repeating pattern of memory cells stops (e.g., at peripheral edges of such a repeating pattern) although the rows of access lines and/or the columns of digit lines may and likely will extend into the peripheral area.

Base substrate 12 may include any one or more of conductive/conductor/conducting (i.e., electrically herein), semiconductive, or insulative/insulator/insulating (i.e., electrically herein) materials. Various materials are shown above base substrate 12. Materials may be aside, elevationally inward, or elevationally outward of the depicted FIG. 1 materials. For example, other partially or wholly fabricated components of integrated circuitry may be provided somewhere above, about, or within substrate 12. Control and/or other peripheral circuitry for operating components within a memory array may also be fabricated, and may or may not be wholly or partially within an array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

A series of laterally-spaced conductive lines 16 has been formed over base substrate 12, along with dielectric material 18 there-between. In some embodiments, conductive lines 16 may be referred to or individually considered as a lower conductor. In this document, unless otherwise indicated, "elevational(ly)", "higher", "upper", "lower", "top", "atop", "bottom", "above", "below", "under", "beneath", "up", and "down" are generally with reference to the vertical direction. Further, "vertical" and "horizontal" as used herein are directions that are perpendicular or within 10 degrees of perpendicular relative one another independent of orientation of the substrate in three-dimensional space. "Horizontal" refers to a general direction (i.e., within 10 degrees) along a primary substrate surface and may be relative to which the substrate is processed during fabrication. Also, "extend(ing) elevationally" and "elevationally-extending" in this document encompasses a range from vertical to no more than 45° from vertical. Further, "extend(ing) elevationally", "elevationally-extending", and "vertical(ly)" with respect to a field effect transistor are with reference to orientation of the transistor's channel length along which current flows in operation between two source/drain regions of the transistor that are at two different elevations. For simplicity and ease of depiction, only two conductive lines 16 are shown although thousands, tens of thousands, etc. would likely be formed within array 14. Further, such lines are shown as being straight-linear although again curved, non-parallel, combination of curved and straight segmented, etc. configurations may be used. A purpose and a circuit configuration of conductive lines 16 are described below.

Example materials for conductive lines 16, and for any conductive material herein, include one or more of elemental metal, a mixture or alloy of two or more elemental metals, conductive metal compounds, and conductively-doped semiconductive materials, with TiN being one specific example for lines 16. Example dielectric material 18 includes silicon nitride and/or doped or undoped silicon dioxide. An example elevational thickness for lines 16 and dielectric 18 is 200 to 1,000 Angstroms.

In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Insulative material 20 has been formed over substrate 12/16/18. In one embodiment, such is shown as comprising three insulative materials 21, 22, and 23. In one embodiment, materials 21 and 23 are of the same composition and material 22 is of different composition from that of materials 21 and 23. An example composition for materials 21 and 23 is doped or undoped silicon dioxide, while that for material 22 is silicon nitride. Example thicknesses for insulative materials 21, 22, and 23 are 1,000 Angstroms to 1.5 microns, 100 to 500 Angstroms, and 200 to 1,500 Angstroms, respectively.

Figure 2:
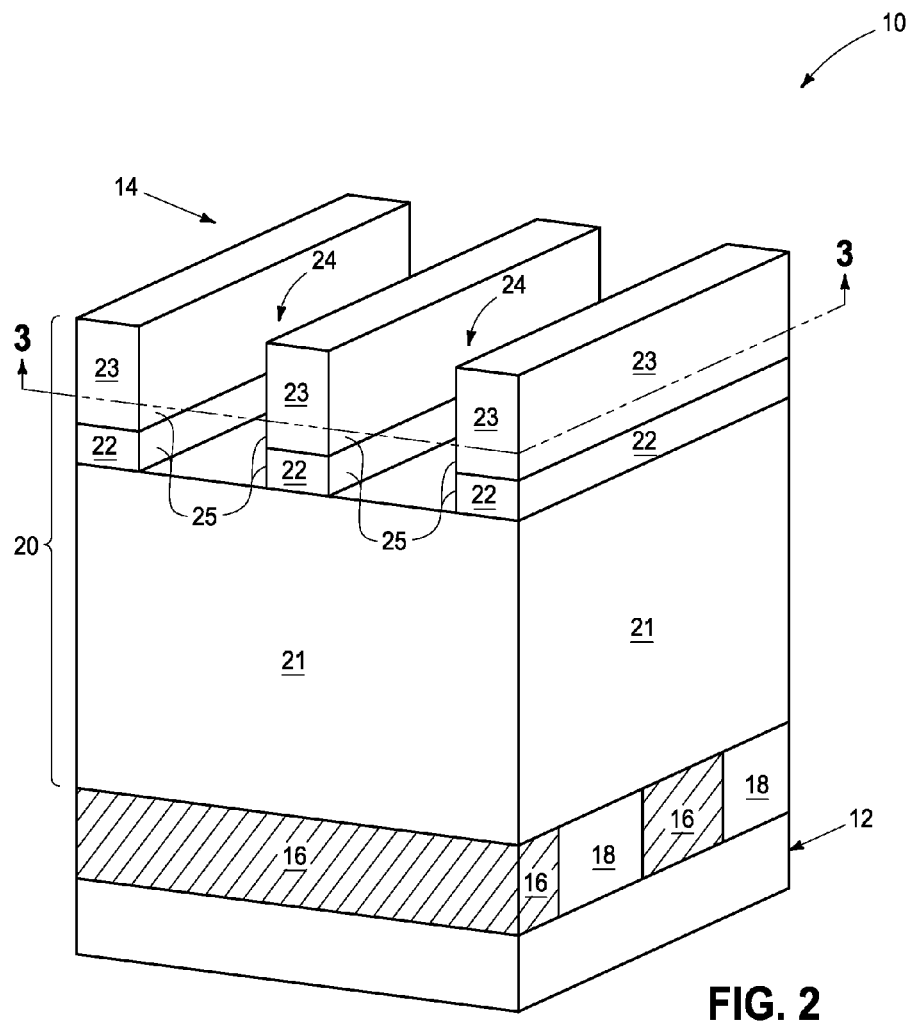
FIG. 2 is a view of the FIG. 1 construction at a processing step subsequent to that shown by FIG. 1.
Figure 3:
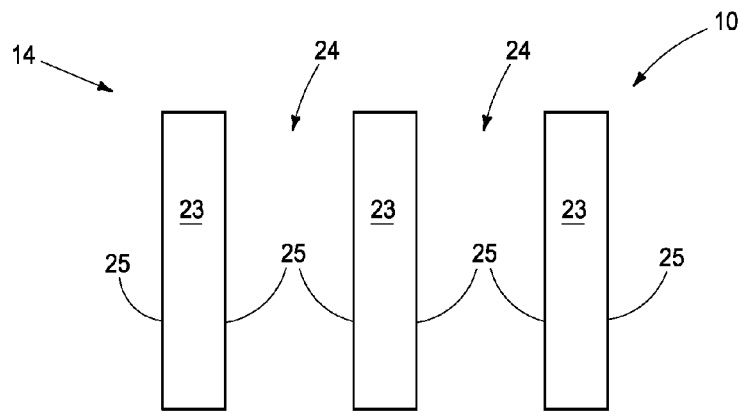
FIG. 3 is a cross-sectional view taken through line 3-3 in FIG. 2.

Referring to FIGS. 2 and 3, trenches 24 have been formed partially into insulative material 20. In one embodiment and as shown, trenches 24 extend through insulative materials 23 and 22 to insulative material 21. Trenches 24 may be formed by any suitable existing or yet-to-be developed technique, such as photolithography with or without pitch-multiplication. Access transistors will be formed at least partially within trenches 24 and accordingly such trenches may be considered as access transistor trenches 24. For purposes of the continuing discussion, individual access transistor trenches 24 may be considered as comprising laterally-opposing sides 25.

Figure 4:
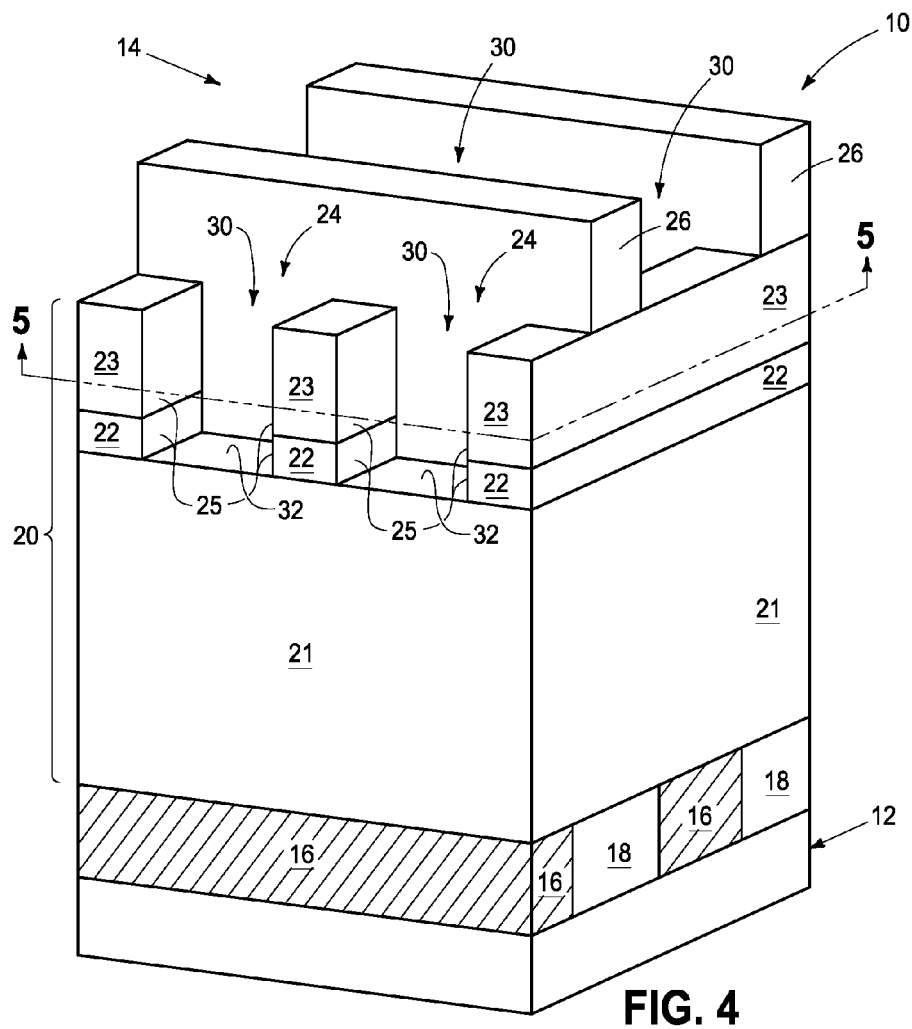
FIG. 4 is a view of the FIG. 2 construction at a processing step subsequent to that shown by FIG. 2.
Figure 5:
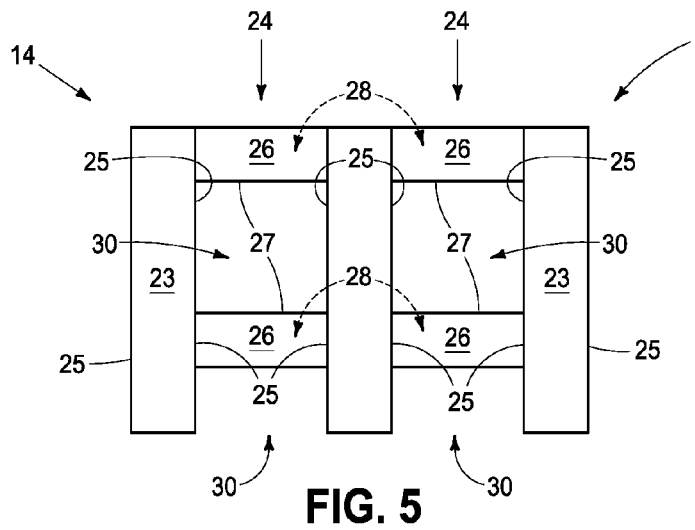
FIG. 5 is a cross-sectional view taken through line 5-5 in FIG. 4.

Referring to FIGS. 4 and 5, masking material 26 has been deposited and patterned as shown to form trenches 24 to individually comprise longitudinally-spaced masked portions 28 and longitudinally-spaced openings 30 longitudinally between masked portions 28. In one embodiment, masking material 26 is insulative, in one embodiment is conductive, and in one embodiment is semiconductive. Regardless, at least some or none of masking material 26 may remain in the finished circuitry construction. Masking material 26 may be patterned using any technique, for example using photolithography with or without pitch multiplication. Individual trench openings 30 may be considered as comprising peripheral sides 25, 27 and a base 32.

Figure 6:
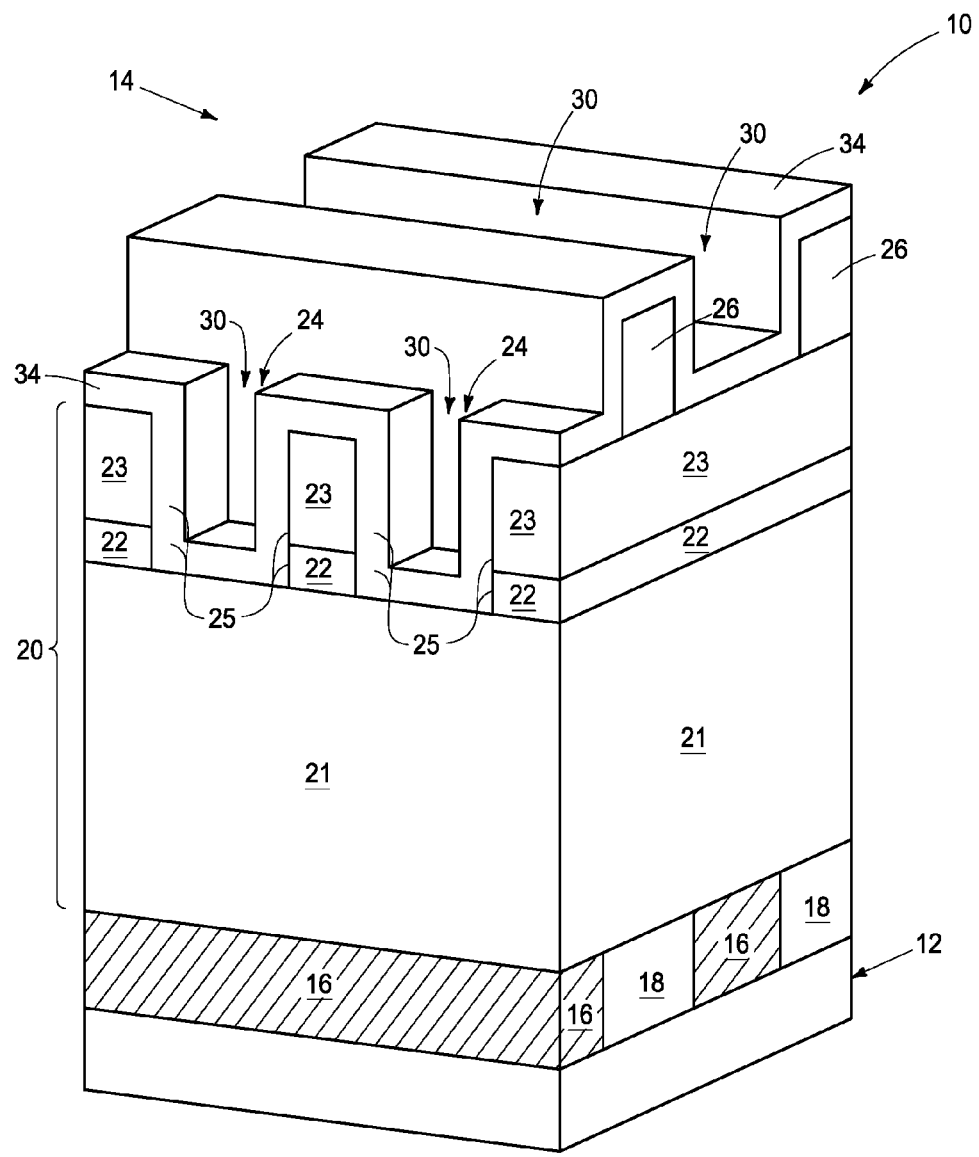
FIG. 6 is a view of the FIG. 4 construction at a processing step subsequent to that shown by FIG. 4.

Referring to FIG. 6, material 34 has been formed over masking material 26 and to line and less-than-fill trench openings 30. Material 34 will be used to form walls within trench openings 30. In one embodiment, material 34 is conductive, in one embodiment is insulative, and in one embodiment is semiconductive. Regardless, ideally material 34 is of different composition from that of material 21. Any suitable conductive, insulative, or semiconductive materials may be used.

Referring to FIGS. 7 and 8, material 34 has been removed substantially from being over horizontal surfaces (e.g., by suitable anisotropic etching), and thus re-exposing trench opening bases 32. In one embodiment and as shown, such has resulted in formation of walls 35, 36, 37, and 38 within trench openings 30. Walls 35 and 37 extend longitudinally in and along individual trench openings 30 against laterally-opposing sides 25 of trenches 24. In one embodiment, walls 35 and 37 are formed to be of different composition from that of insulative material that is laterally-adjacent (e.g., 22, 23) trenches 24. In one embodiment, walls 35, 37 are conductive, in one embodiment are semiconductive, and in one embodiment are insulative. In one embodiment, walls 35, 37 do not extend into space (e.g., masked portions 28) that is longitudinally between trench openings 30. In one embodiment, such walls may also extend into space (not shown in FIGS. 7 and 8) that is longitudinally between trench openings 30, and as will be described with respect to additional embodiments below. In one embodiment and as shown, walls 35, 36, 37, and 38 encircle about trench openings 30 and are against (in one embodiment, directly against) peripheral sides 25, 27 of individual trench openings 30.

Regardless, in one embodiment, walls 35, 36, 37, and 38 form individual mask openings 40 within individual trench openings 30, and in some embodiments which will comprise channel openings as will be apparent from the continuing discussion. In one embodiment, the depicted FIGS. 7 and 8 removing is conducted without any mask being atop the substrate within array 14.

Figure 9:
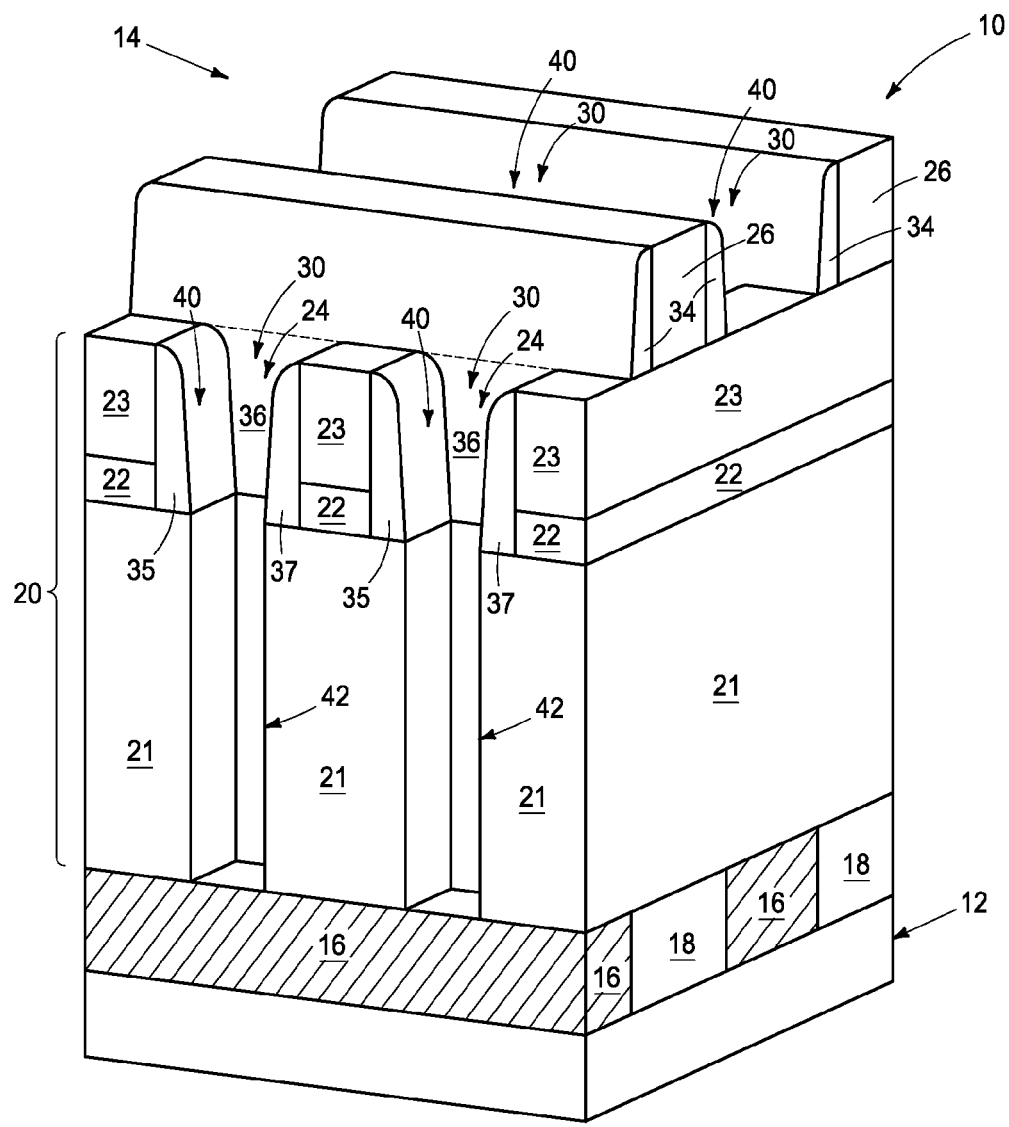
FIG. 9 is a view of the FIG. 7 construction at a processing step subsequent to that shown by FIG. 7.

Referring to FIG. 9, at least some of insulative material 20 that is under trench openings 30 has been removed through bases 32 (not shown) of trench openings 30 between walls 35, 37 and masked portions 28 (not designated in FIG. 9) shown in to form individual capacitor openings 42 in insulative material 20 that is lower than walls 35, 37. In one embodiment, such has been conducted radially inward of encircling walls 35, 36, 37, and 38 to form individual capacitor openings 42 in insulative material 20. In one embodiment, insulative material (e.g., 23) that is laterally-adjacent trenches 24, walls 35/36/37/38, and masked portions 28 have been used as a mask during the depicted removal. An example technique for forming capacitor openings 42 includes photolithographic patterning and etch with or without pitch multiplication. An example anisotropic plasma chemistry for etching through silicon dioxide is a combination of $C_4F_6$, $C_4F_8$, and Ar, while that for etching through silicon nitride is a combination of $CH_2F_2$, $CF_4$, and $O_2$. In one embodiment and as shown, capacitor openings 42 have been formed through insulative material 20 to upwardly expose lower conductors 16. For simplicity and clarity, array 14 of construction 10 is only shown as comprising four capacitor openings (only the front two openings being viewable and designated with numerals 42) although again likely hundreds, thousands, millions, etc. would be formed within array 14. Capacitor openings 42 may individually be of any one or more shapes in horizontal cross-section, for example circular, ellipsoidal, 4-sided (e.g., square or rectangular), 6-sided, a combination of straight and curved sides, etc. Capacitor openings 42 are shown as having straight vertical sidewalls, although such may be non-vertical and/or not straight. An example maximum open dimension for individual capacitor openings 42 is 300 to 600 Angstroms.

Figure 10:
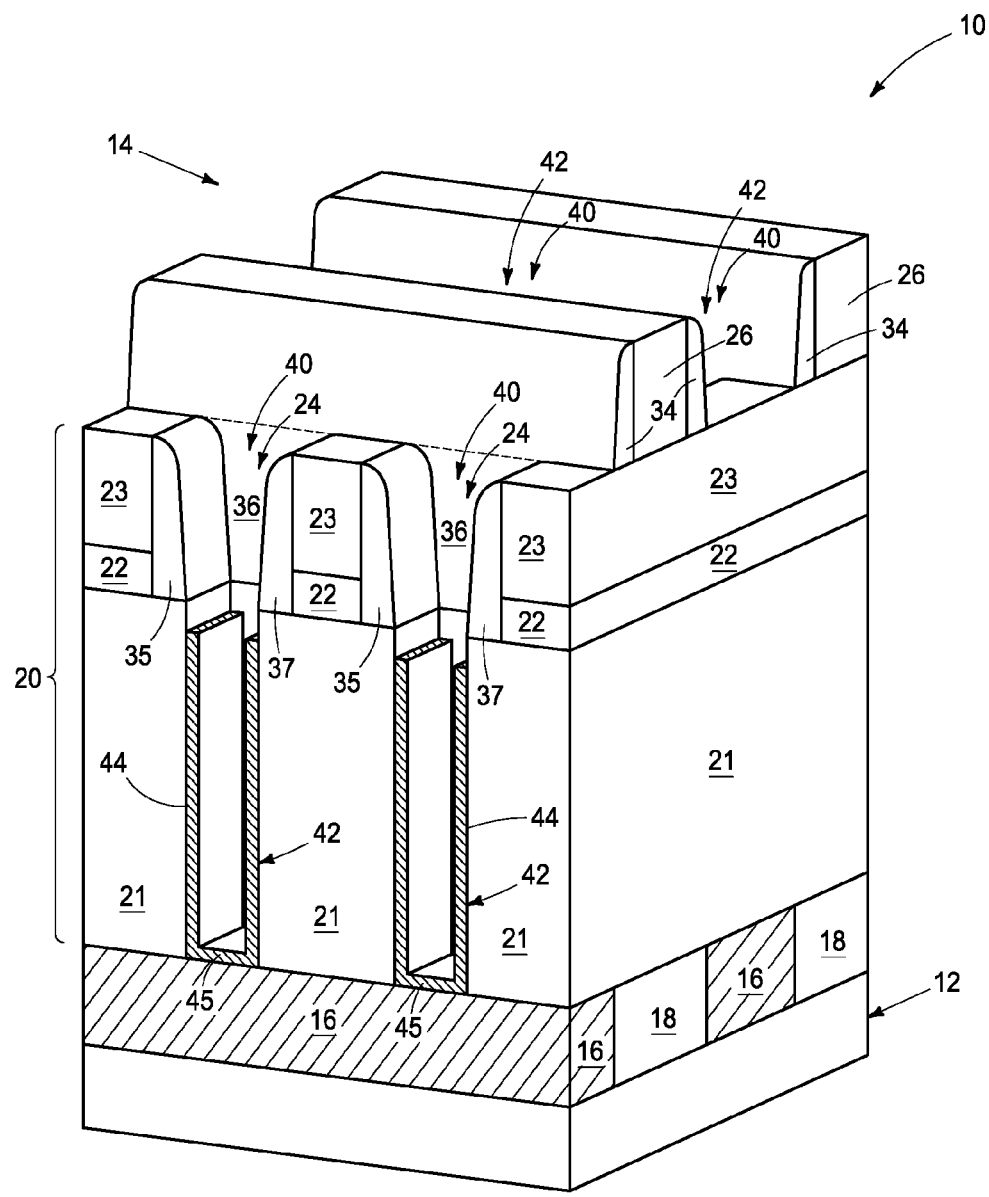
FIG. 10 is a view of the FIG. 9 construction at a processing step subsequent to that shown by FIG. 9.

Individual capacitors are formed in individual capacitor openings 42. An example method of doing so is described with reference to FIGS. 10-12. Referring to FIG. 10, a capacitor electrode 44 has been formed in individual capacitor openings 42. In one embodiment and as shown, such is of an upwardly-open container shape, and in one embodiment is a laterally-outer (e.g., radially outer) electrode of the individual capacitors being formed. In one embodiment and as shown, laterally-outer electrode 44 having the upwardly-open container shape has been formed to have a bottom 45 extending laterally to and between sidewalls electrode 44. Alternately and by way of example only, electrode 44 may individually comprise an upwardly and downwardly-open (not shown) conductive material cylinder (e.g., little or no bottom 45 extending between sidewalls of electrode 44). An example technique of forming capacitor electrode 44 is deposition of any suitable conductive material (e.g., TiN), followed by filling at least lower portions of the depicted container shapes with a fill material (e.g., photoresist), followed by etching the conductive material of electrode 44 back to be recessed relative to an upper surface of insulative material 21, for example as shown. An example thickness for the material of electrode 44 is 30 to 50 Angstroms. In one embodiment, capacitor electrode 44 is electrically coupled (in one embodiment, directly electrically coupled) to one of individual lines 16. In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components.

Figure 11:
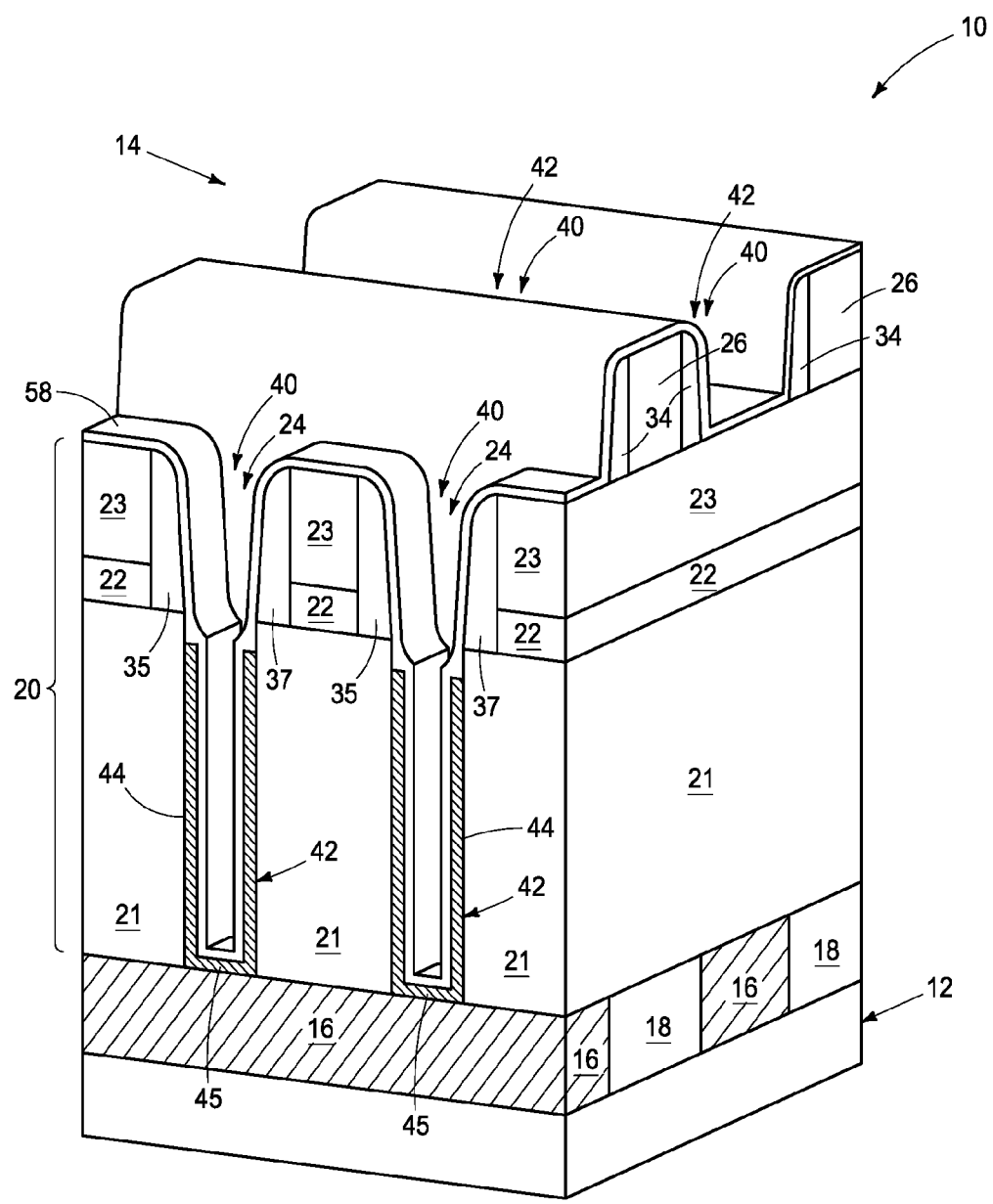
FIG. 11 is a view of the FIG. 10 construction at a processing step subsequent to that shown by FIG. 10.

Referring to FIG. 11, capacitor insulator 58 has been formed as shown. In one example embodiment, capacitor insulator 58 comprises programmable material such that the capacitors that will be formed are non-volatile and programmable into at least two different magnitude capacitive states (e.g., whereby the programmable material is both sufficiently thick and remains insulative in the different states such that a current sufficient to erase a stored state does not flow there-through at operating voltages). Example such programmable materials include ferroelectric materials, conductive bridging RAM (CBRAM) materials, phase change materials, and resistive RAM (RRAM) materials, with ferroelectrics believed to be ideal. Example ferroelectric materials include ferroelectrics that have one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element. In one embodiment, capacitor insulator 58 comprises dielectric material such that the capacitors are volatile. For example, such can comprise one or more of non-programmable dielectric materials such as silicon dioxide, silicon nitride, aluminum oxide, high-k dielectrics, etc. whereby no charge is retained in material 58 upon removal or sufficient reduction of voltage/potential from one or both of two capacitor electrodes of the capacitor. Non-volatile programmable capacitors may have a capacitor insulator that has a suitable combination of programmable material(s) and non-programmable material(s). Regardless, an example thickness for capacitor insulator 58 is 30 to 100 Angstroms.

Figure 12:
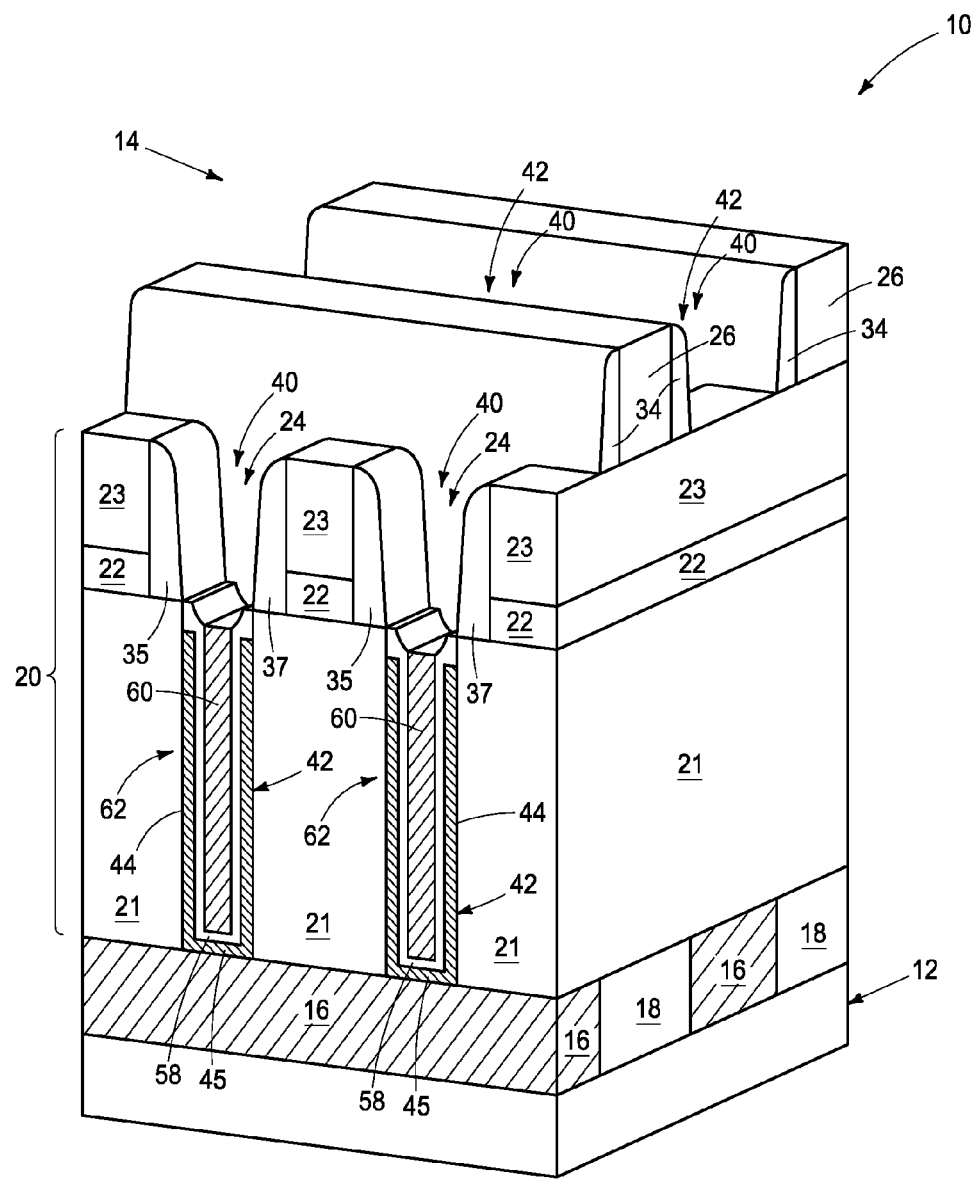
FIG. 12 is a view of the FIG. 11 construction at a processing step subsequent to that shown by FIG. 11.

Referring to FIG. 12, another capacitor electrode 60 has been formed, thus forming individual capacitors 62 in individual capacitor openings 42. In one embodiment and as shown, capacitor 62 comprises a laterally-inner electrode 60 that is laterally-inward of upwardly-open container shape electrode 44, and in one embodiment with laterally-inner electrode 60 being, from side-to-side, entirely solid from top to bottom in horizontal cross-section. Capacitor electrode 60 may be of any suitable conductive composition, and may be formed by deposition to fill remaining volume of capacitor openings 42, followed by etch-back to produce a construction such as shown.

A line of access transistors is ultimately formed in individual trenches 24, with the line of access transistors electrically coupling to individual capacitors that are along that line. Such may be conducted by any existing or yet-to-be developed manner(s). One such example is next described with reference to FIGS. 13-18.

Figure 13:
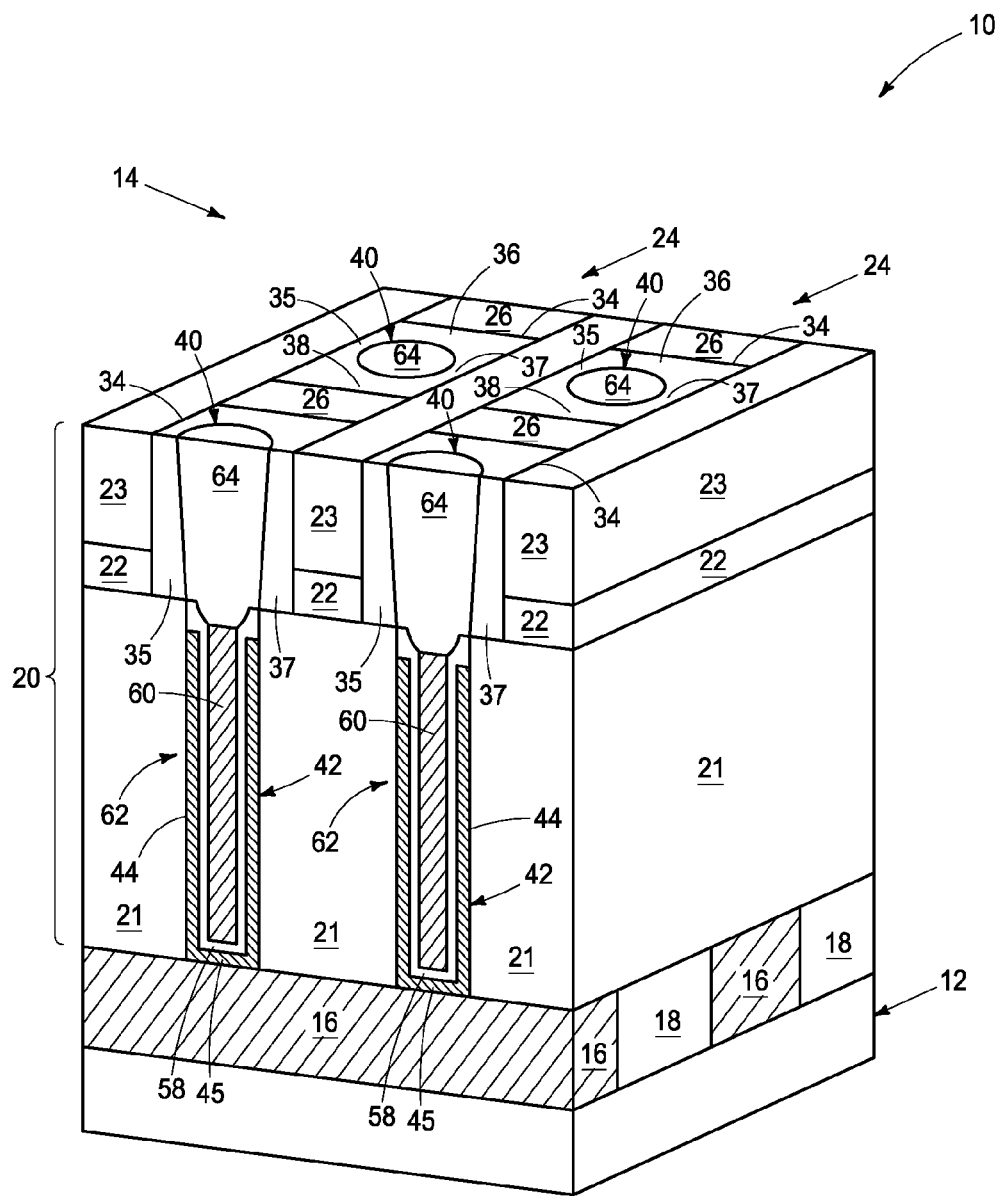
FIG. 13 is a view of the FIG. 12 construction at a processing step subsequent to that shown by FIG. 12.

Referring to FIG. 13, sacrificial material 64 has been deposited within mask openings 40 to plug such openings, followed by planarizing construction 10 back at least to an uppermost surface of insulative material 23. Sacrificial material 64 may be any of conductive, insulative, and/or semiconductive.

Figure 14:
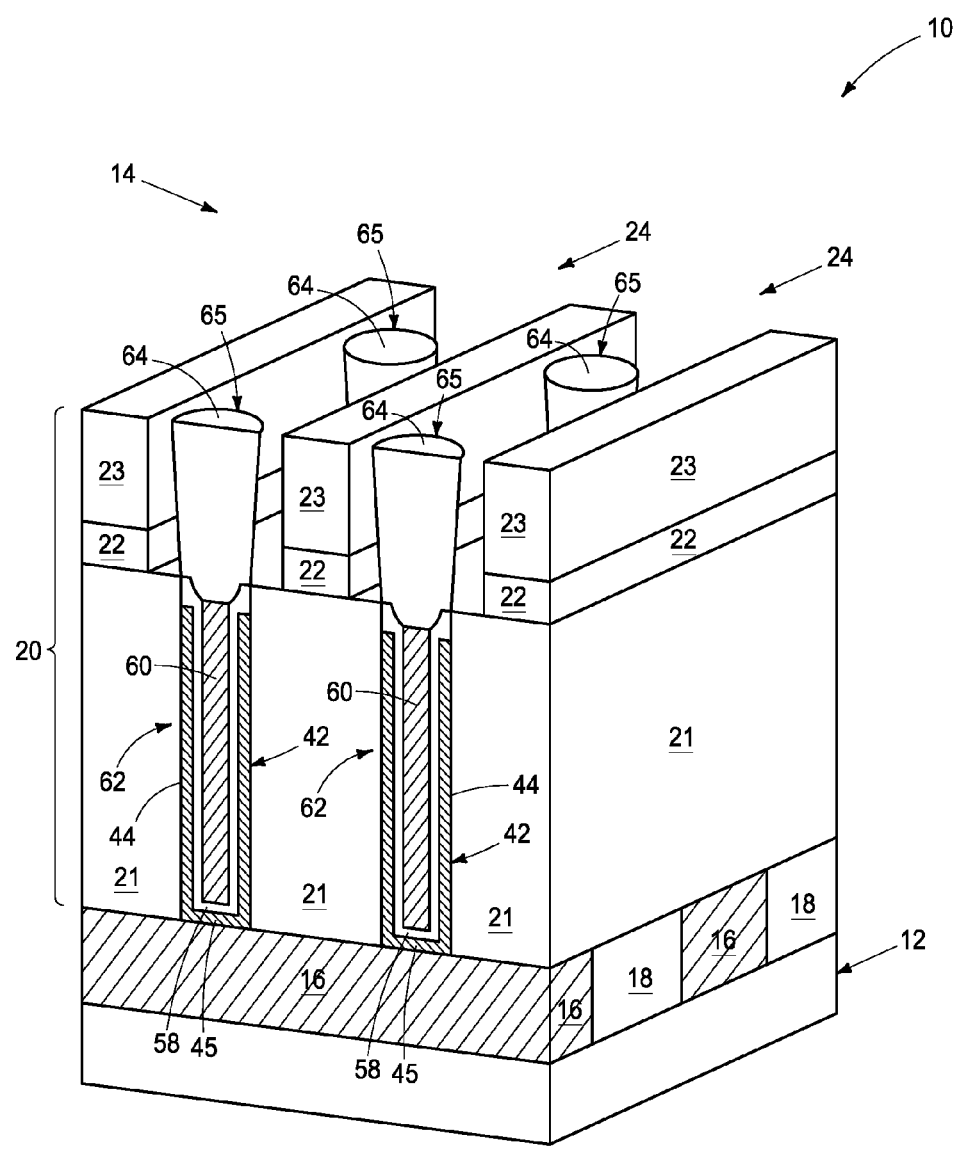
FIG. 14 is a view of the FIG. 13 construction at a processing step subsequent to that shown by FIG. 13.

Referring to FIG. 14 and in one embodiment, sacrificial encircling walls 35, 36, 37, and 38 (not shown) have been removed and in one embodiment as shown masking material 26 (not shown) has also been removed, thereby forming longitudinally-spaced sacrificial pillars 65 within trenches 24. In one such embodiment and as shown, such comprises a method of removing all of sacrificial material 26 (not shown) after forming trench openings 30 (not designated in FIG. 14). Regardless and in one embodiment as shown, masking material 26 (not shown) has been removed from trenches 24 such that longitudinally-spaced sacrificial pillars 65 have no solid material between them longitudinally along individual trenches 24.

Figure 15:
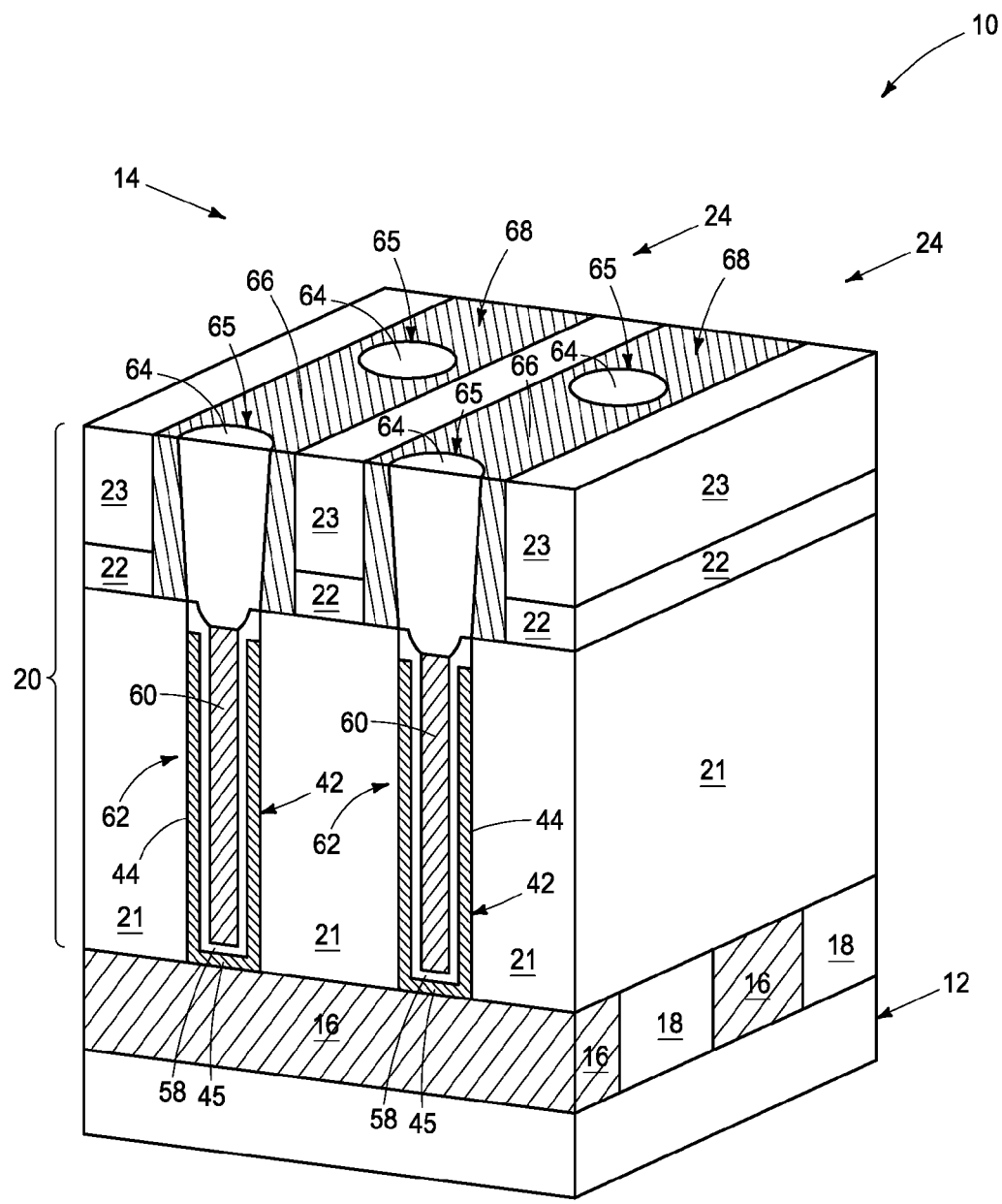
FIG. 15 is a view of the FIG. 14 construction at a processing step subsequent to that shown by FIG. 14.

Referring to FIG. 15, conductive material 66 has been formed in and along trenches 24 about sacrificial material pillar 65, thus forming an access line 68 in individual trenches 24.

Figure 16:
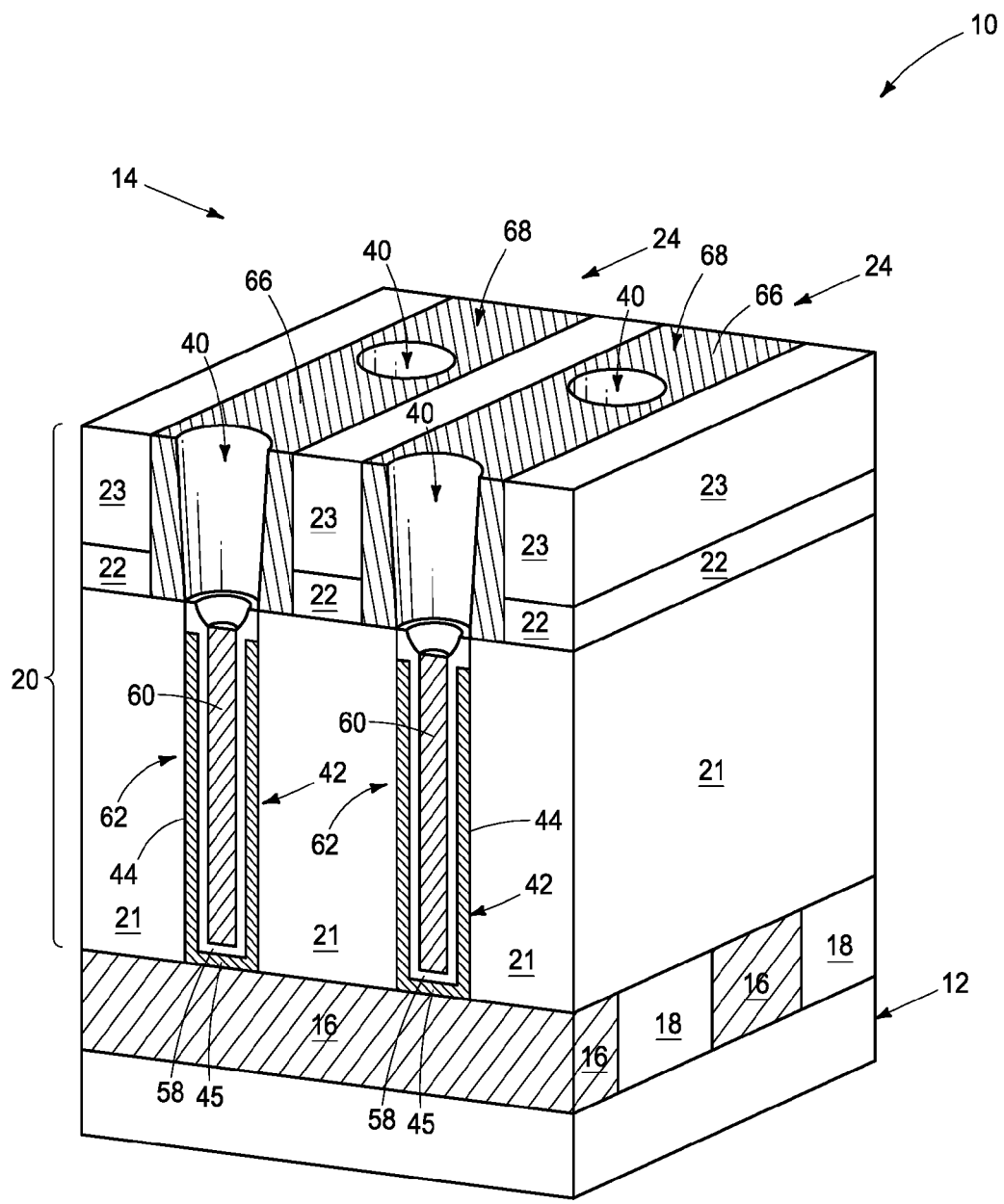
FIG. 16 is a view of the FIG. 15 construction at a processing step subsequent to that shown by FIG. 15.

Referring to FIG. 16, sacrificial material pillars 65 (not shown) have been removed to transform former mask openings 40 to be channel openings 40 in individual access lines 68 in trenches 24.

Figure 17:
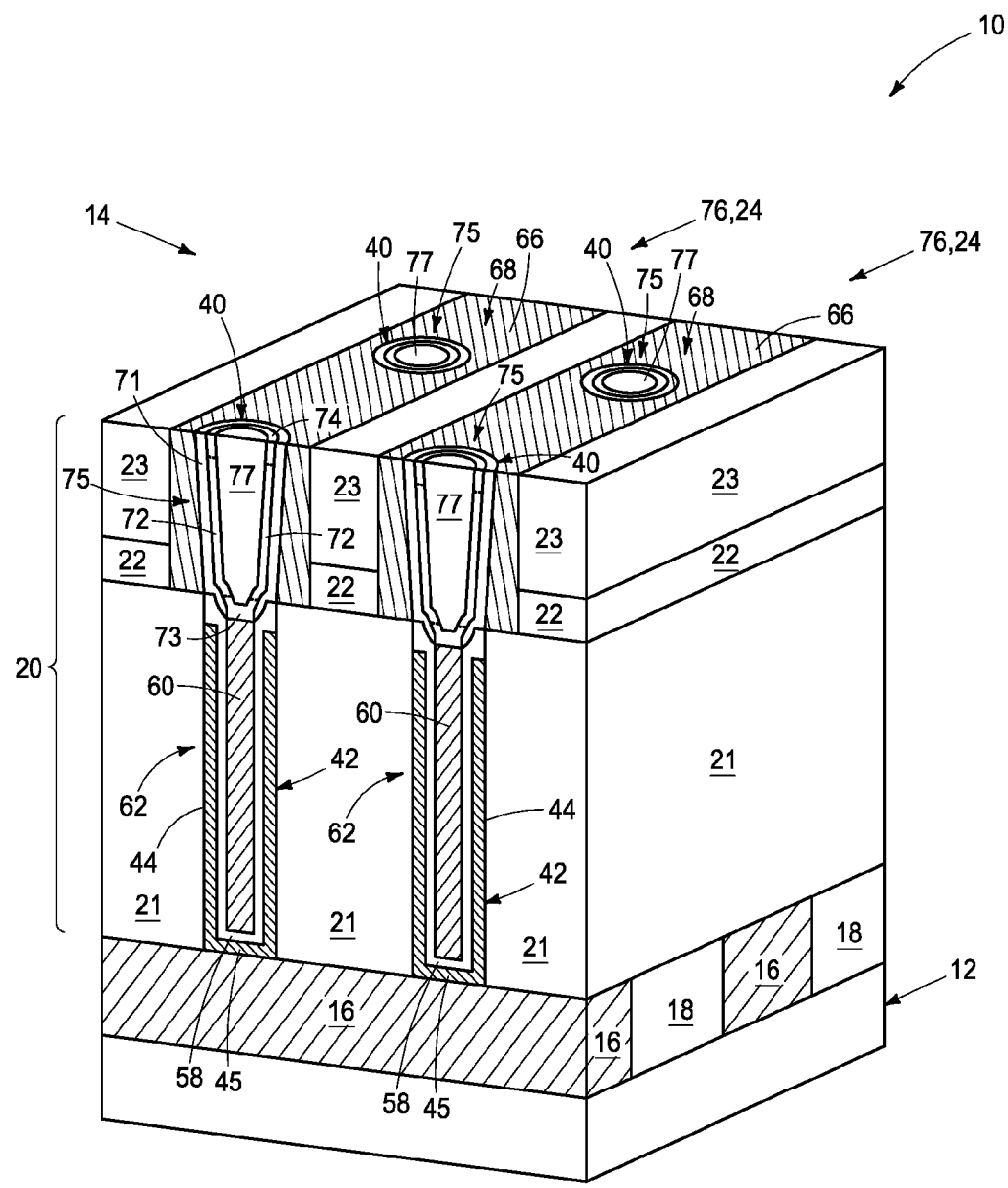
FIG. 17 is a view of the FIG. 16 construction at a processing step subsequent to that shown by FIG. 16.

Referring to FIG. 17, gate insulator 71 (e.g., silicon dioxide, silicon nitride, high-k dielectric, ferroelectric material, etc.) and channel material 72 (e.g., polysilicon) have been formed in channel openings 40. Gate insulator 71 may be deposited to line channel openings 40, followed for example by being subjected to an anisotropic etch (e.g., a reactive ion spacer etch) to remove it from being centrally over bases of channel openings 40. Channel material 72, by way of example, may be variously suitably doped during deposition of semiconductive-capable material whereby in the example depicted embodiment a lowest-most region 73 and an uppermost region 74 are suitably conductively doped to function as conductive source/drain regions, having semiconductive channel material 72 there-between. Access line 68, gate insulator 71, channel material 72, and source/drain regions 73, 74 are formed to comprise a line 76 of access transistors 75 in individual trenches 24, with such access transistors of the respective lines electrically coupling (in one embodiment directly electrically coupling) to individual capacitors 62 that are along that line of access transistors 75. Those portions of individual access lines 68 that are laterally adjacent gate insulator 71 and channel material 72 of individual transistors 75 effectively form individual access gates of such individual transistors. In one embodiment and as shown, access transistors 75 are formed to comprise hollow channels 72, and thereby are hollow channel transistors. Hollow channels 72 may be plugged with solid insulative material 77 (e.g., silicon dioxide or silicon nitride) as shown.

Embodiments of the invention also encompass methods of forming an array of memory cells individually comprising a capacitor and a transistor, with the array comprising rows of access lines and columns of digit lines, as well as such arrays independent of method of manufacture. By way of example only, such a method and constructions are next described with reference to FIGS. 18-21.

Figure 18:
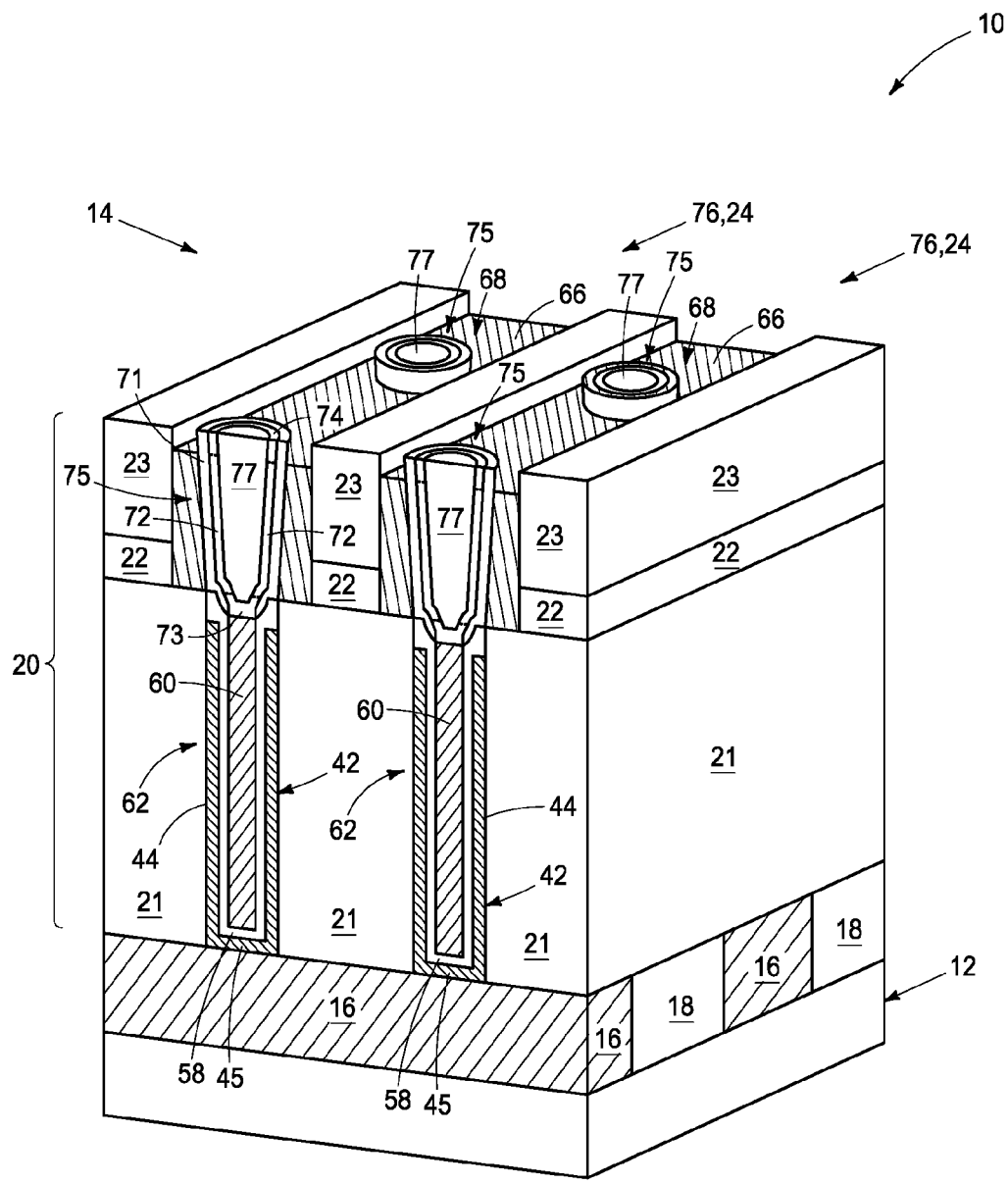
FIG. 18 is a view of the FIG. 17 construction at a processing step subsequent to that shown by FIG. 17.

Referring to FIG. 18, material 66 of access lines 68 has been recessed back (e.g., by a timed etch) selectively relative to gate insulator 71, material of source/drain regions 74, material 23, and material 77. In this document, a selective etch or removal is an etch or removal where one material is removed relative to another stated material at a rate of at least 2.0:1.

Figure 19:
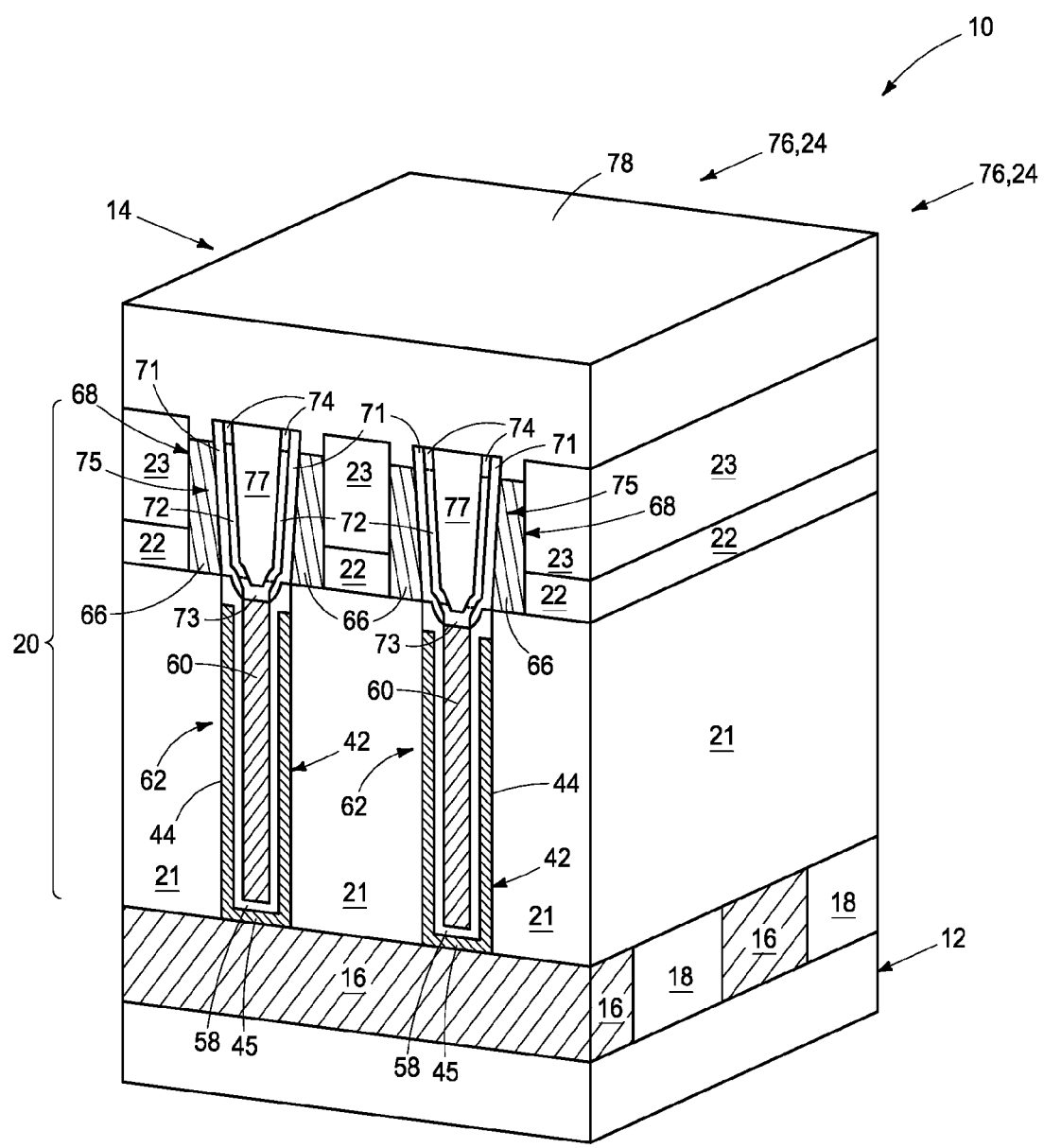
FIG. 19 is a view of the FIG. 18 construction at a processing step subsequent to that shown by FIG. 18.

Referring to FIG. 19, an isolation dielectric 78 has been deposited to fill the elevational recesses formed in FIG. 18.

Figure 20:
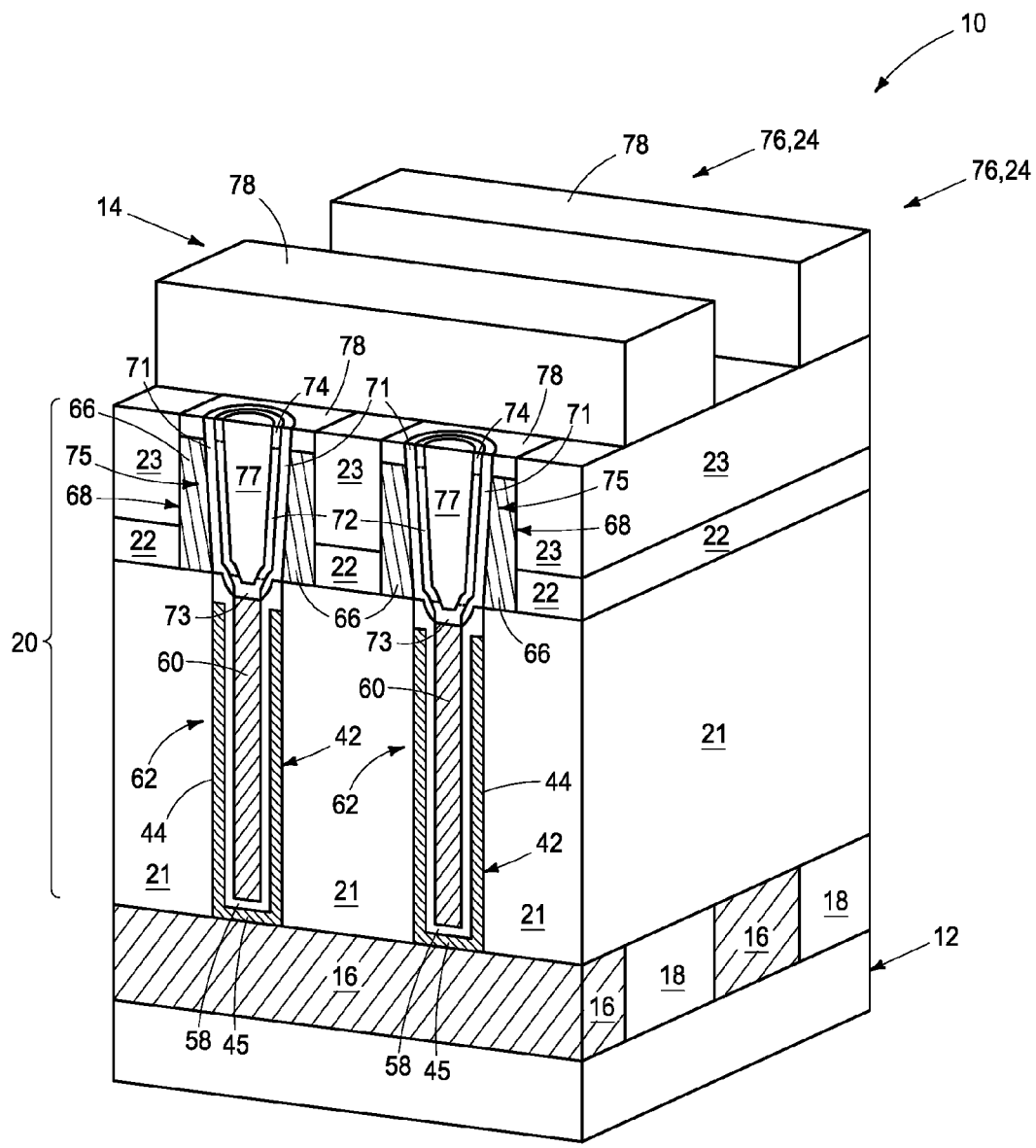
FIG. 20 is a view of the FIG. 19 construction at a processing step subsequent to that shown by FIG. 19.

Referring to FIG. 20, dielectric material 78 has been patterned as shown to form trenches there-between over source/drain regions 74 of individual transistors 75.

Figure 21:
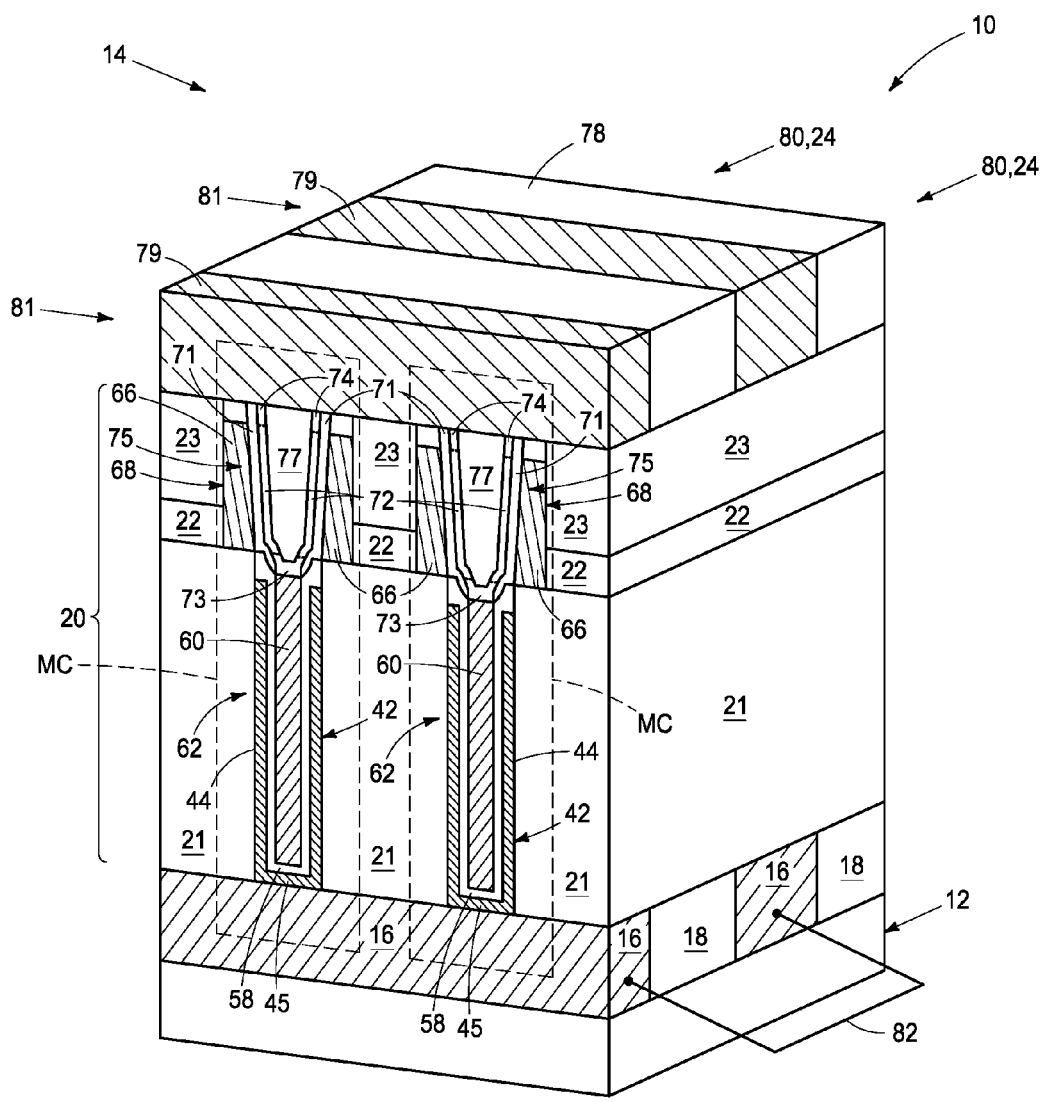
FIG. 21 is a view of the FIG. 20 construction at a processing step subsequent to that shown by FIG. 20.

Referring to FIG. 21, conductive material has been deposited and planarized back as shown to form digit lines 79 that are electrically coupled (in one embodiment directly electrically coupled) to source/drain regions 74 of individual transistors 75, thus forming individual memory cells MC.

Any other attribute(s) or aspect(s) as described herein and/or shown may be used in the embodiments described above with reference to FIGS. 1-21.

An example alternate method of forming an array of capacitors and access transistors there-above is next described with reference to FIGS. 22-24 with respect to a construction 10b. Like numerals from the above-described embodiments have been used where appropriate, with some differences being indicated with the suffix "b" or with different numerals. The processing shown with respect to FIGS. 6-14 shows ultimate removal of all of masking material 34 and resultant walls 35, 36, 37, and 38 from construction 10. Such may not be desirable particularly where masking material 34 comprises a conductive material. For example, FIG. 22 is intended to show such with respect to a conductive material 34b that is hatched.

Figure 22:
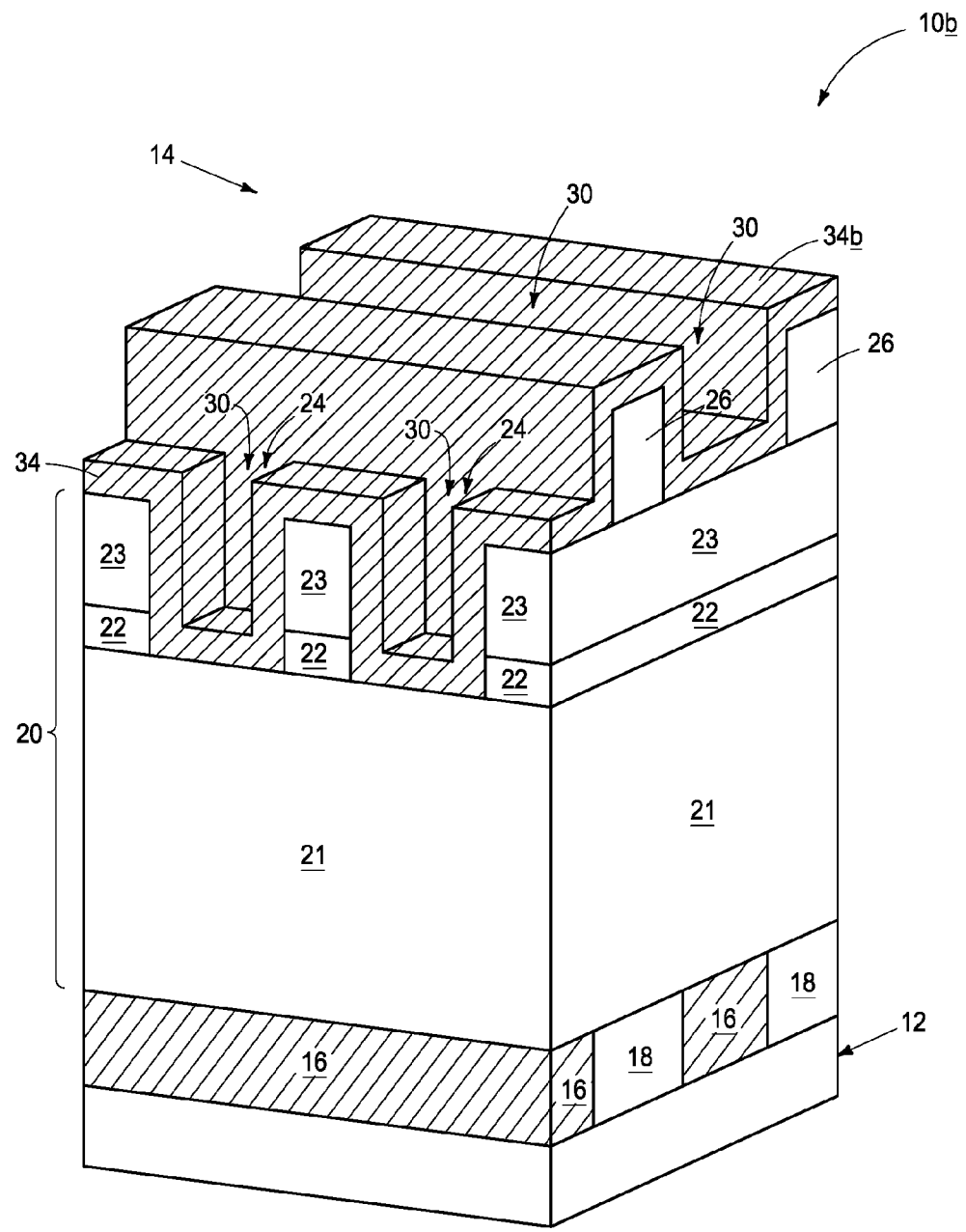
FIG. 22 is a perspective view of a substrate construction in process in accordance with an embodiment of the invention.
Figure 23:
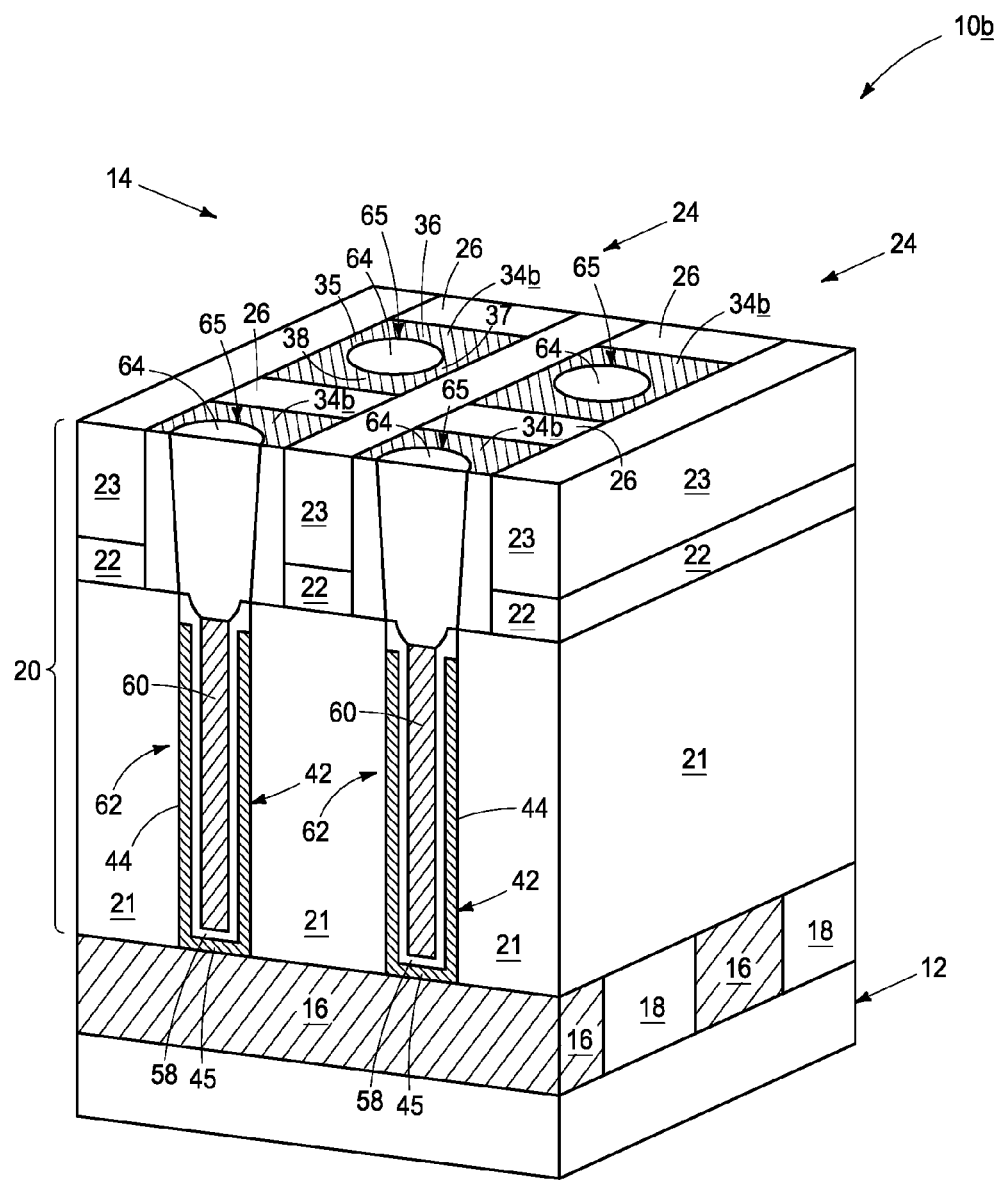
FIG. 23 is a view of the FIG. 22 construction at a processing step subsequent to that shown by FIG. 22.

Referring to FIG. 23, such shows analogous processing of the FIG. 22 substrate through and to the processing depicted by FIG. 13 of the above-described embodiments with respect to construction 10. Thereby, and as an example, dielectric masking material 26 remains in FIG. 23 within trenches 24.

Figure 24:
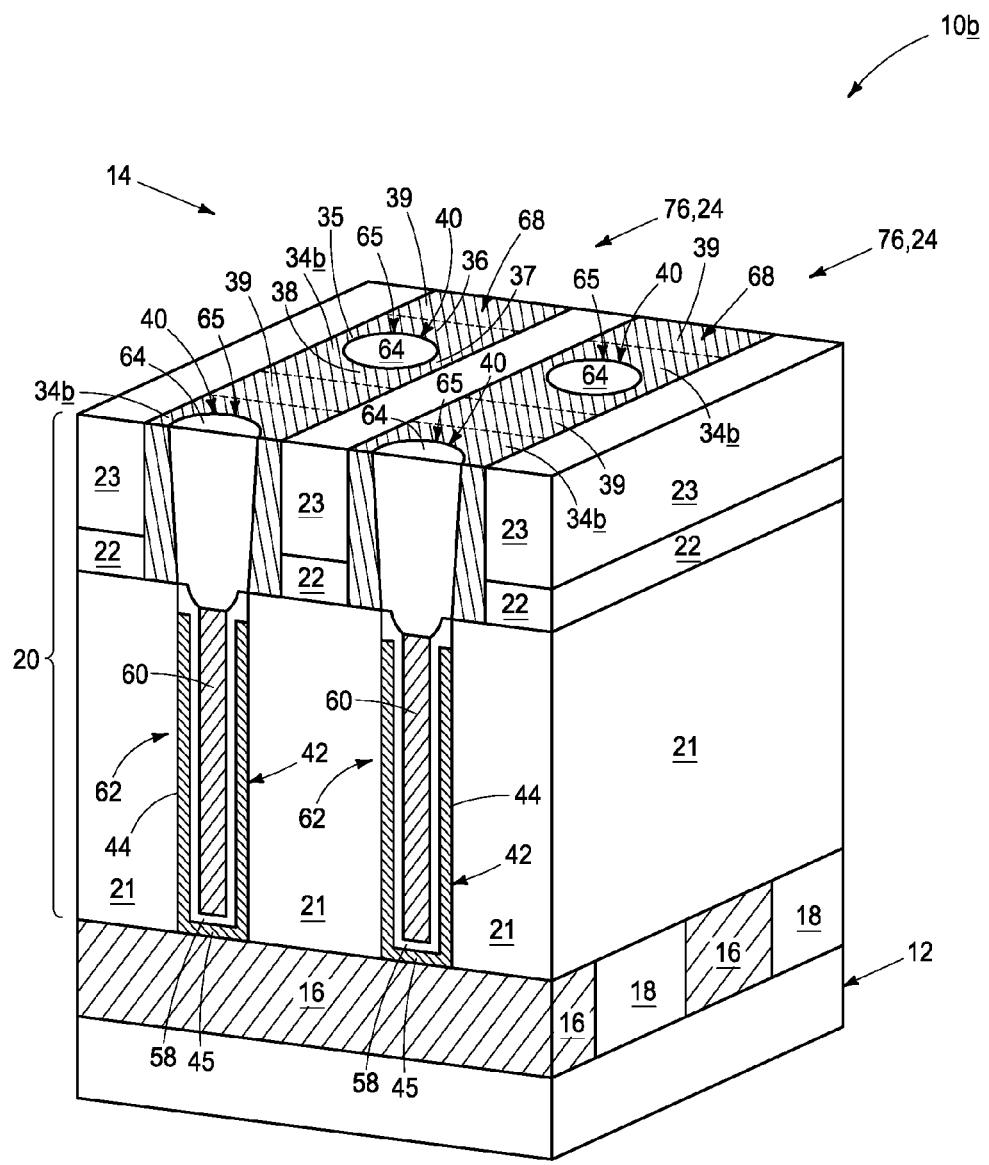
FIG. 24 is a view of the FIG. 23 construction at a processing step subsequent to that shown by FIG. 23.

Referring to FIG. 24, material 26 (not shown) from FIG. 23 has been removed and conductive material 39 has been formed in-place thereof and has been planarized back at least to the uppermost surface of material 23. Conductive material 39 may be of the same or different composition as that of material 34b, with same composition being shown by dashed interface lines between materials 34b and 39. Such effectively forms trench openings 40 within which sacrificial material pillars 65 are received as comprising channel openings 40 as channels will be formed therein. Sacrificial pillars 65 would be removed, followed by analogous processing to that described above with respect to at least FIGS. 16 and 17 to form transistors 75. Any other attribute(s) or aspect(s) as described herein and/or shown may be used.

The above described embodiment with respect to forming construction 10b is but one example embodiment wherein encircling walls 35, 36, 37, and 38 are formed to be conductive, and with such encircling walls comprising individual access line 68 in trenches 24. In one such embodiment and as shown, no portion of masking material 26 remains to comprise an access line 68, and in one embodiment shows removing of all of masking material 26 from individual trenches 24.

An alternate method embodiment is next described with reference to FIGS. 25-27 with respect to a construction 10c. Like numerals from the above-described embodiments have been used where appropriate, with some differences being indicated with the suffix "c". Construction 10c in FIG. 25 shows masking material 26c as comprising conductive material by the depicted hatching thereof.

Figure 25:
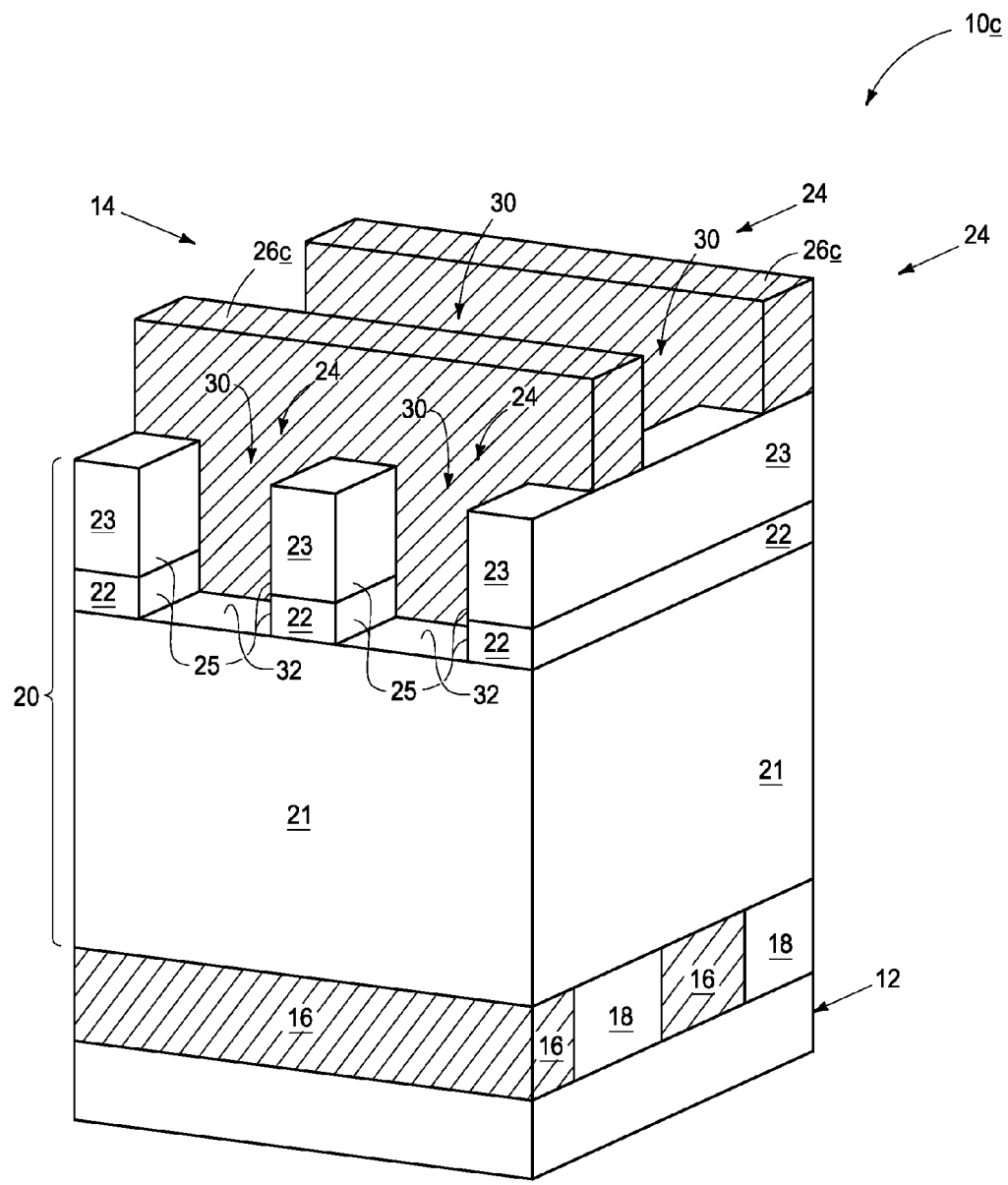
FIG. 25 is a perspective view of a substrate construction in process in accordance with an embodiment of the invention.
Figure 26:
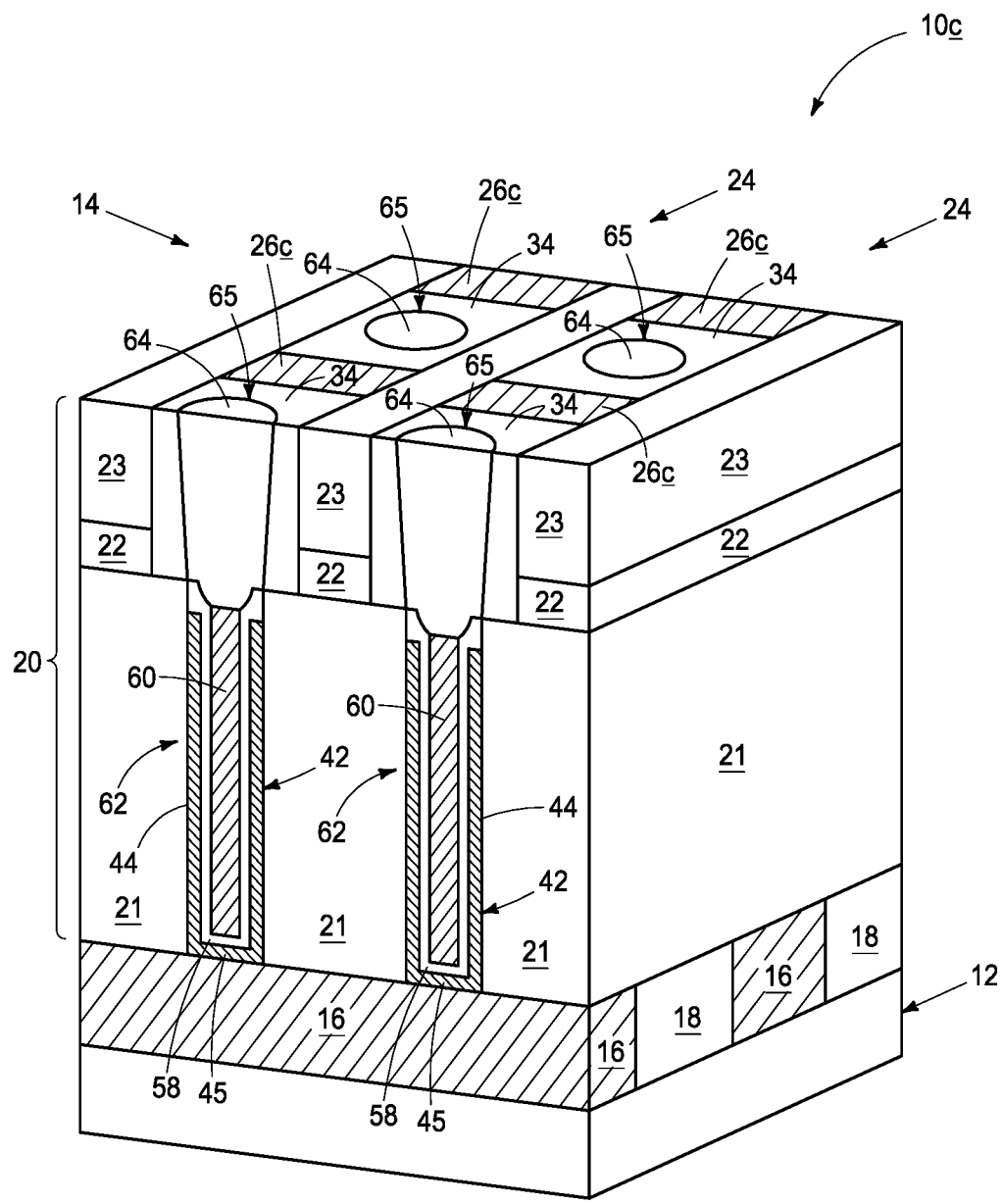
FIG. 26 is a view of the FIG. 25 construction at a processing step subsequent to that shown by FIG. 25.

FIG. 26 shows analogous processing of the FIG. 25 substrate through and to the processing depicted by FIG. 13 of the above-described embodiments with respect to construction 10.

Figure 27:
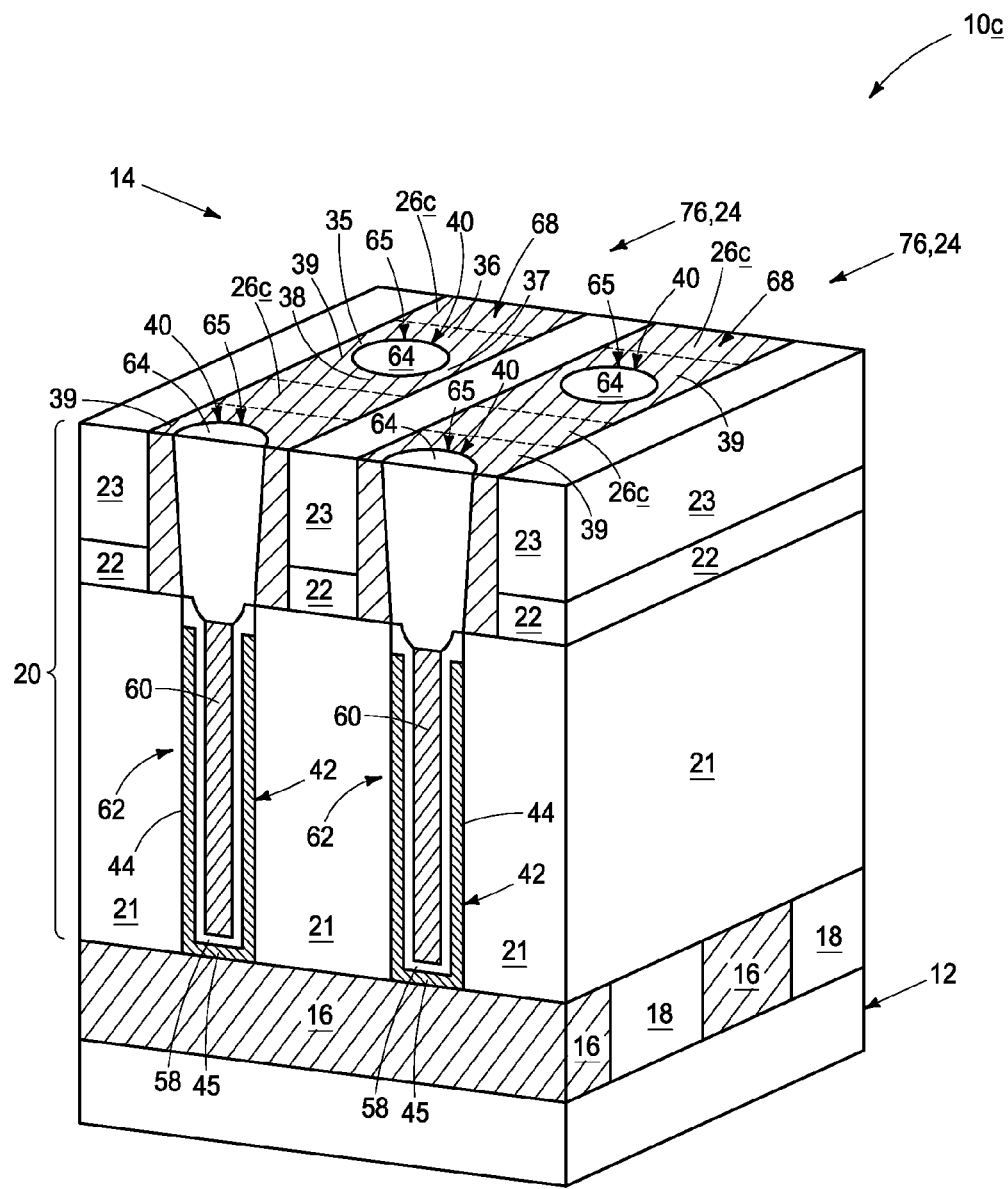
FIG. 27 is a view of the FIG. 26 construction at a processing step subsequent to that shown by FIG. 26.
Figure 28:
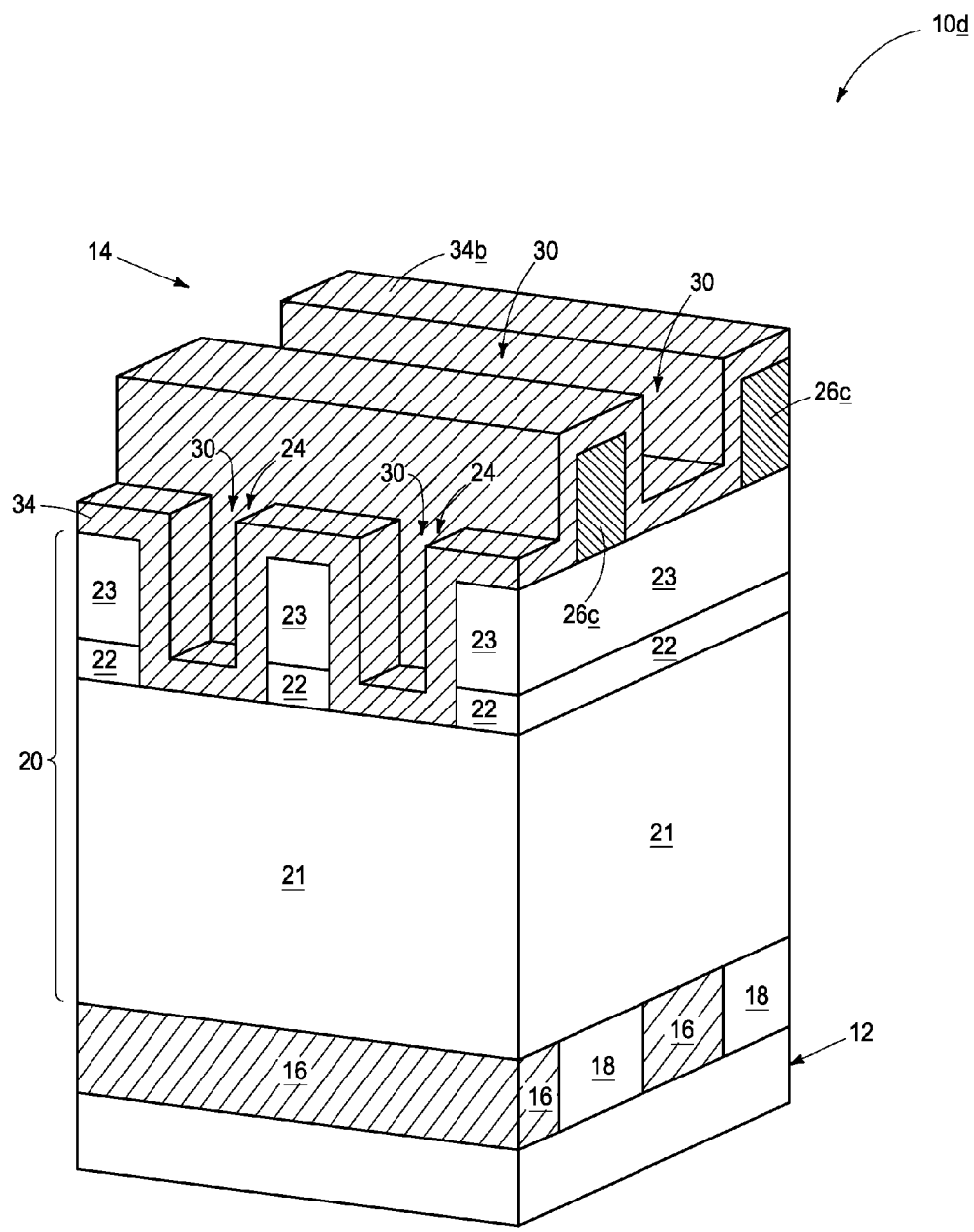
FIG. 28 is a perspective view of a substrate construction in process in accordance with an embodiment of the invention.

Referring to FIG. 27, material 34 (not shown) from FIG. 26 has been removed and conductive material 39 has been formed in-place thereof and has been planarized back at least to the uppermost surface of material 23. Conductive material 39 may be of the same or different composition as that of material 26c, with same composition being shown by dashed interface lines between materials 26c and 39. Such effectively forms trench openings 40 within which sacrificial material pillars 65 are received as comprising channel openings 40. Sacrificial pillars 65 would be removed, followed by analogous processing to that described above with respect to at least FIGS. 16 and 17 to form transistors 75. Accordingly, and in one embodiment, conductive masking material 26c may remain as part of the finished circuitry construction and comprise an access line 68 of a line 76 of access transistor 75 in individual trenches 24. Any other attribute(s) or aspect(s) as described herein and/or shown may be used The above described processing relative to construction 10b and 10c may be combined, for example as described with reference to FIGS. 28 and 29 with respect to a construction 10d. Like numerals from the above-described embodiments have been used where appropriate, with some differences being indicated with the suffix "d". FIG. 28 shows each of materials 26c and 34b as being conductive by hatching per the embodiments of 10c and 10b, respectively. Materials 26c and 34b in construction 10d may be of the same or different composition, with different composition being shown by different hatching and solid interface lines between materials 26c and 34b.

Figure 29:
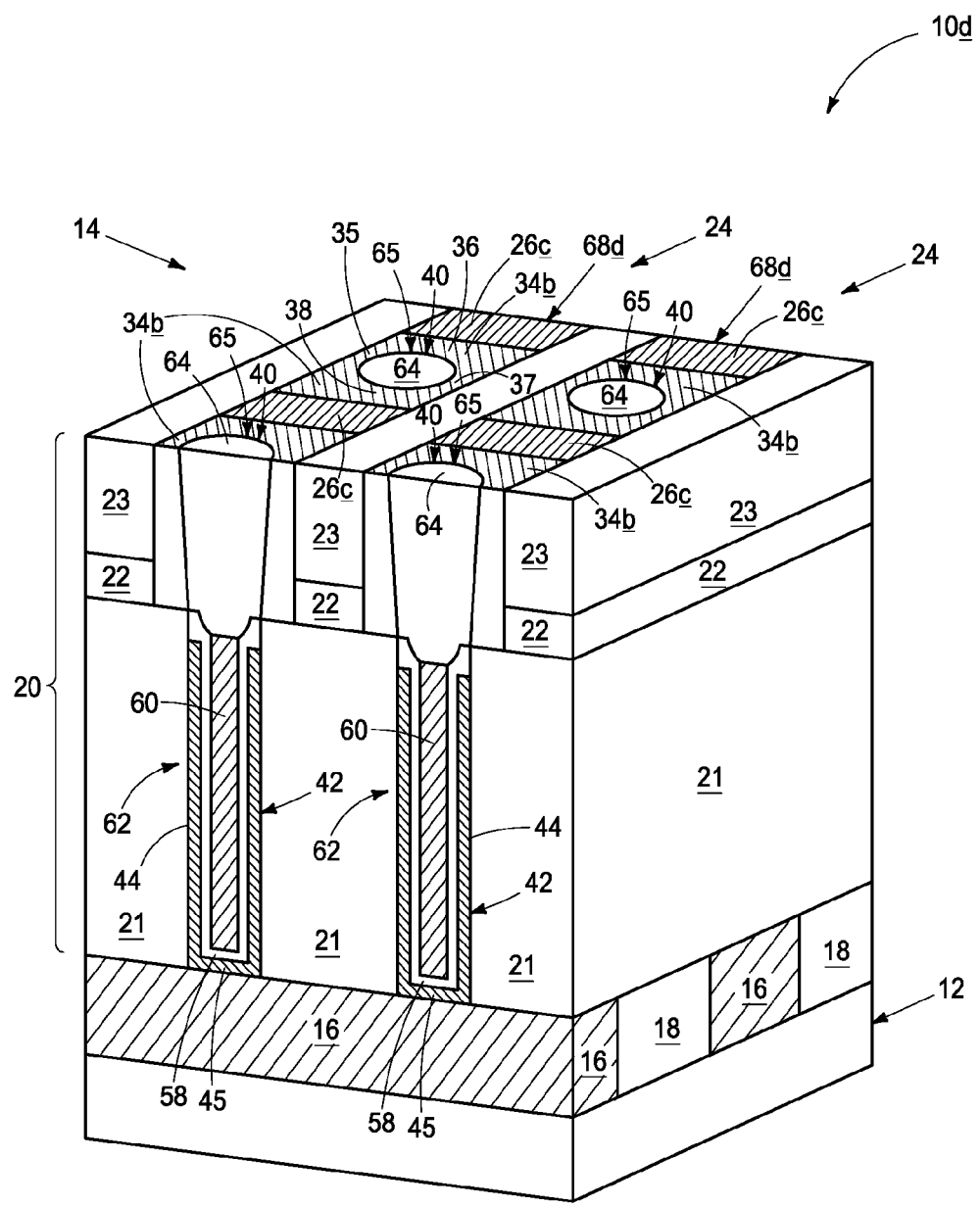
FIG. 29 is a view of the FIG. 28 construction at a processing step subsequent to that shown by FIG. 28.

FIG. 29 shows subsequent processing analogous to that described above with respect to FIGS. 7-13 and whereby access lines 68d have been formed. Openings 40 therein comprise channel openings 40 within which transistor materials can be formed analogously to that described above with respect to FIG. 17. Any other attribute(s) or aspect(s) as described herein and/or shown may be used.

In one embodiment, the masking material is conductive and at least some of which remains to comprise the access line. In one embodiment, no portion of the masking material remains to comprise the access line. In one embodiment, all of the masking material is removed from the individual trenches. In one embodiment, the encircling walls are formed to be conductive and comprise the access line. In one embodiment, at least some of the encircling walls are removed and the at least some of the encircling walls are replaced with conductive material that comprises the access line. In one such embodiment, all of the encircling walls are removed and replaced with the conductive material.

Another example embodiment of forming an array of capacitors and access transistors there-above is next described with reference to FIGS. 30-36 with respect to a construction 10*e*. Like numerals from the above-described embodiments have been used where appropriate, with some differences being indicated with the suffix "e" or with different numerals.

Figure 30:
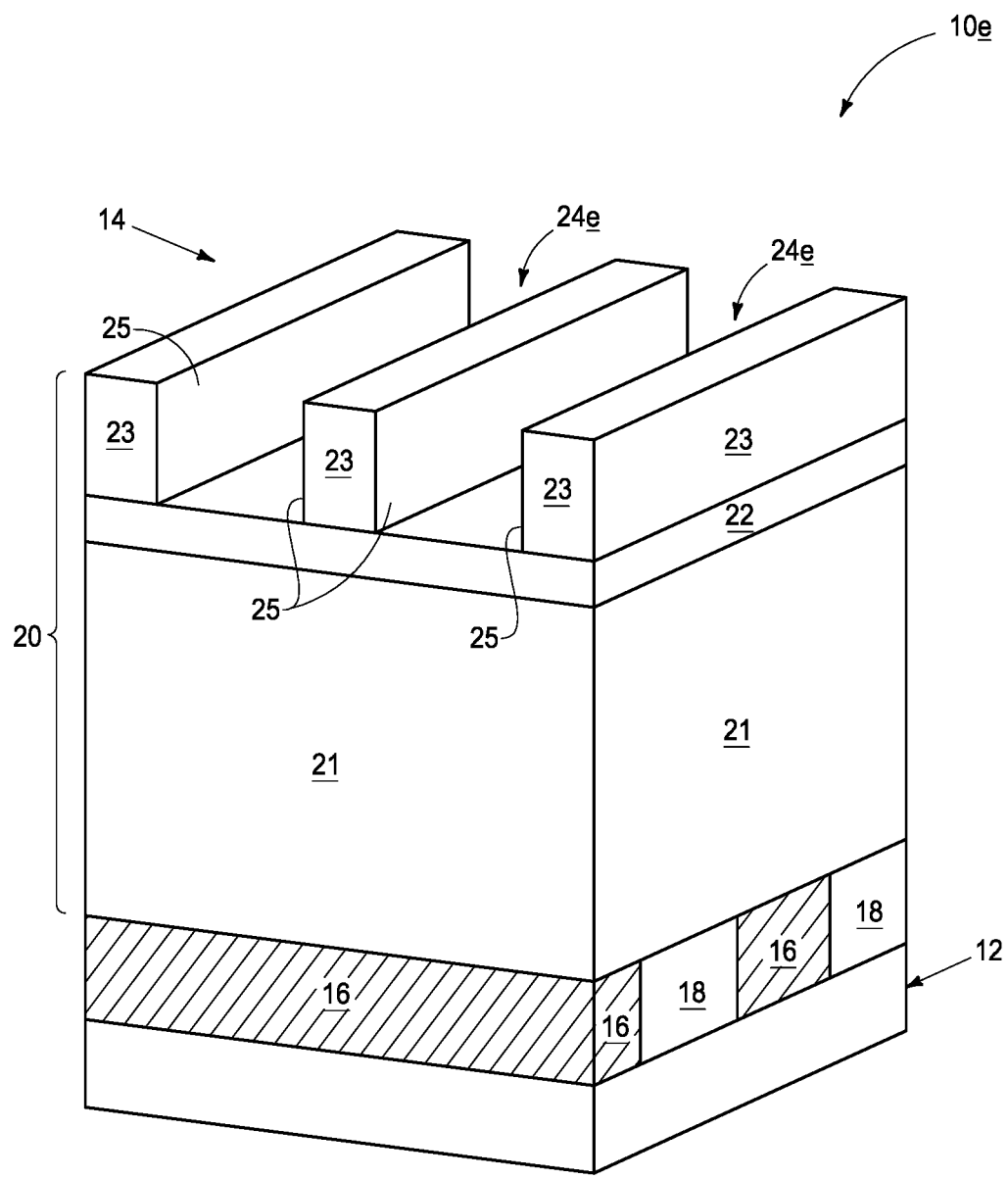
FIG. 30 is a perspective view of a substrate construction in process in accordance with an embodiment of the invention.

Referring to FIG. 30, trenches 24*e* have been formed within material 23 to material 22.

Figure 31:
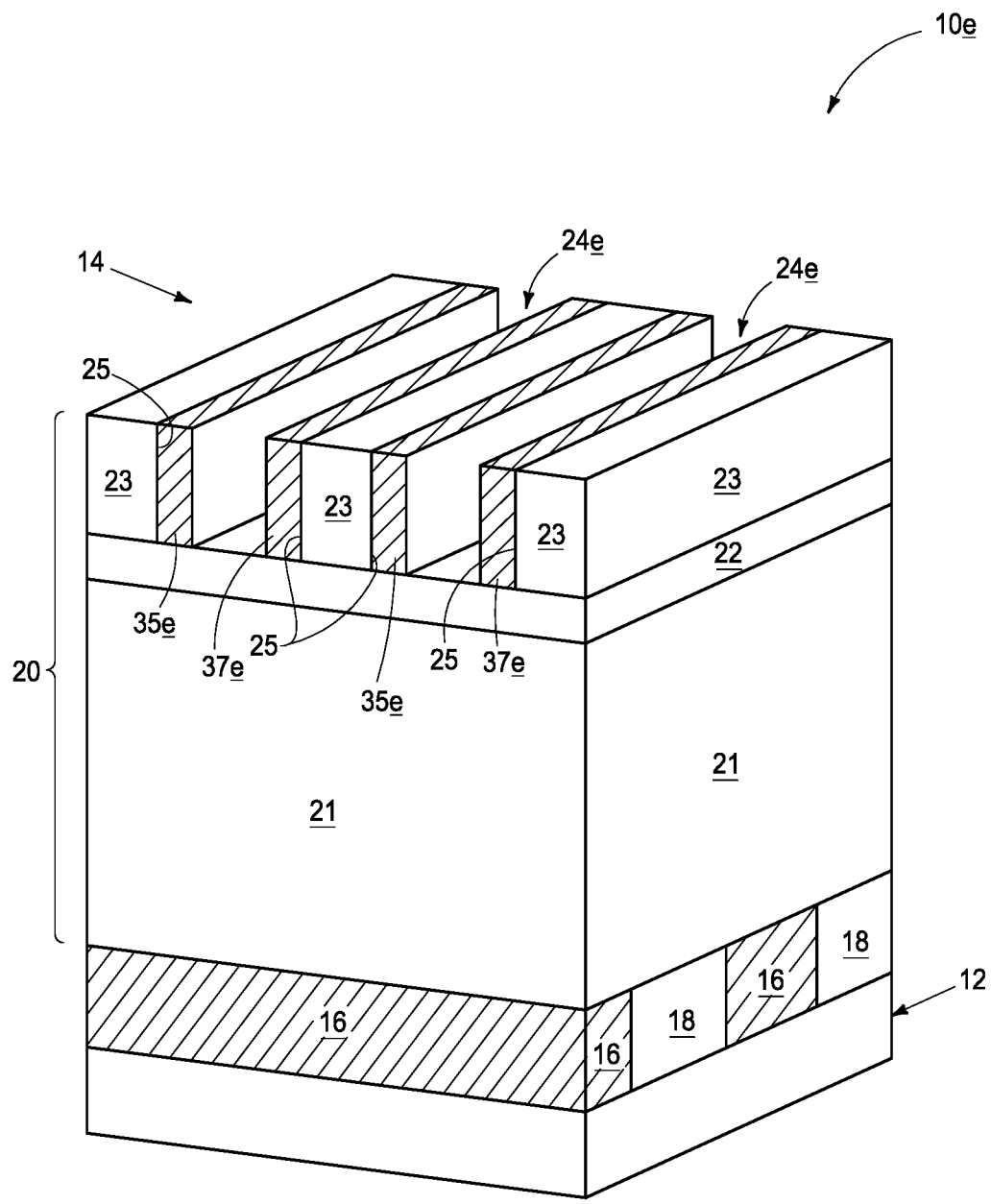
FIG. 31 is a view of the FIG. 30 construction at a processing step subsequent to that shown by FIG. 30.

Referring to FIG. 31, a pair of access line walls 35*e*, 37*e* has been formed in individual trenches 24*e*, with such walls extending longitudinally in and along the individual trenches against laterally-opposing sides 25 of trenches 24*e*. Such may be formed, by way of example, by deposition of conductive material followed by anisotropic etching thereof to produce a construction as shown. Such may be conducted without any masking material being within array 14.

Figure 32:
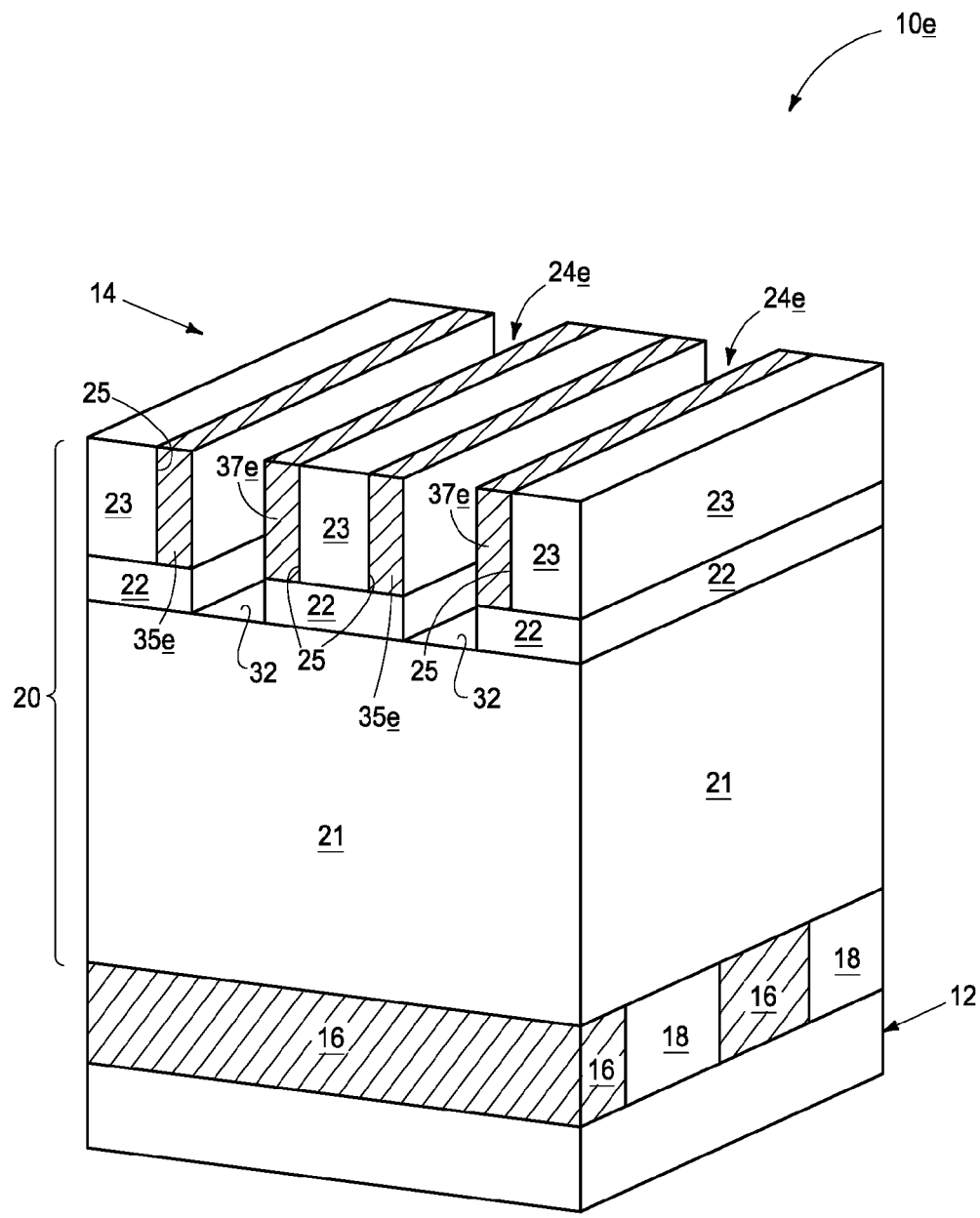
FIG. 32 is a view of the FIG. 31 construction at a processing step subsequent to that shown by FIG. 31.

Referring to FIG. 32, anisotropic etching has been conducted through material 22 using material 23 and material of walls 35*e*, 37*e* as a mask.

Figure 33:
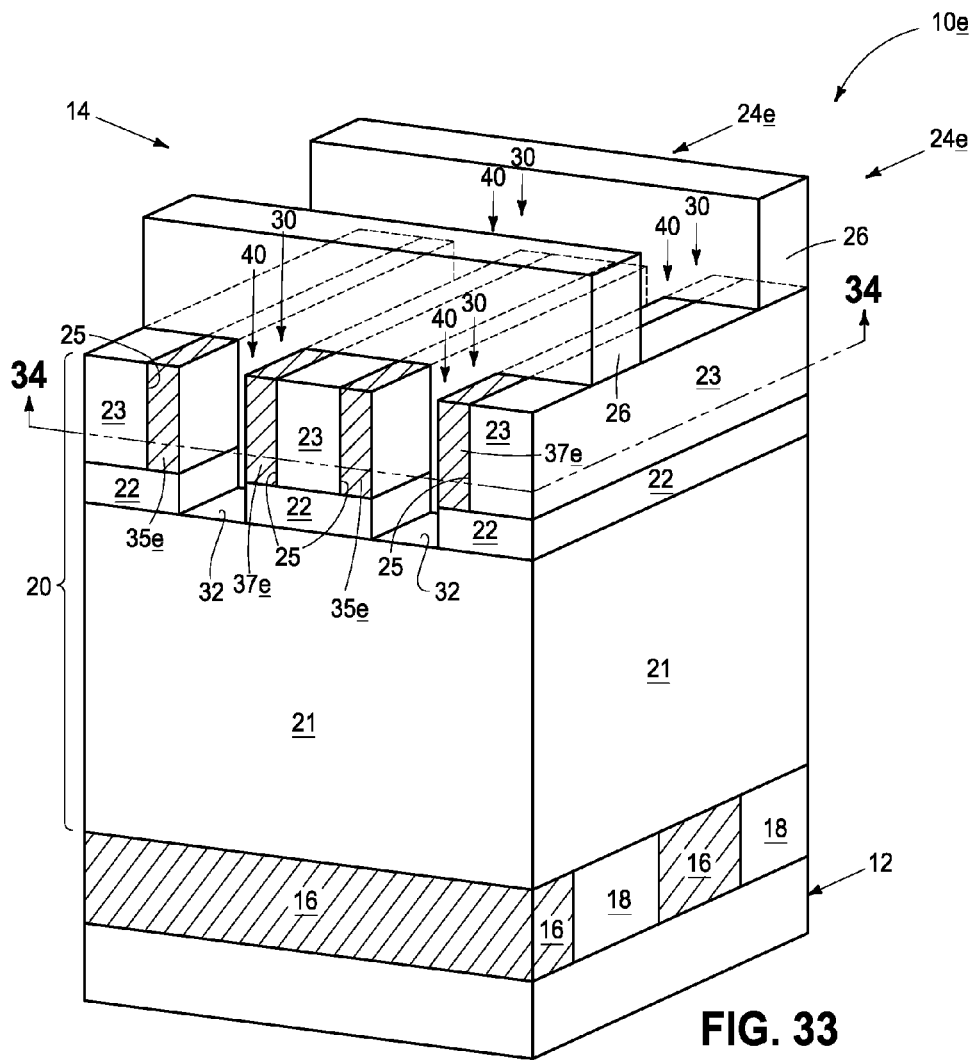
FIG. 33 is a view of the FIG. 32 construction at a processing step subsequent to that shown by FIG. 32.
Figure 34:
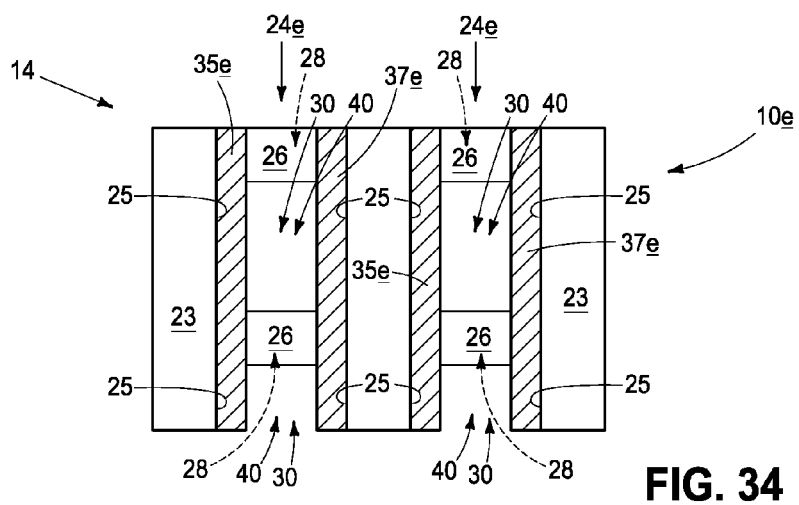
FIG. 34 is a cross-sectional view taken through line 34-34 in FIG. 33.

Referring to FIGS. 33 and 34, masking material 26 has been deposited and patterned as shown analogously to that described above with respect to FIGS. 4 and 5. Such is but one example method of forming longitudinally-spaced masked portions 28 and longitudinally-spaced channel openings 40/mask openings 30 in trenches 24*e* longitudinally between masked portions 28. Again, masking material 26 may be any of insulative, semiconductive, and conductive.

Figure 35:
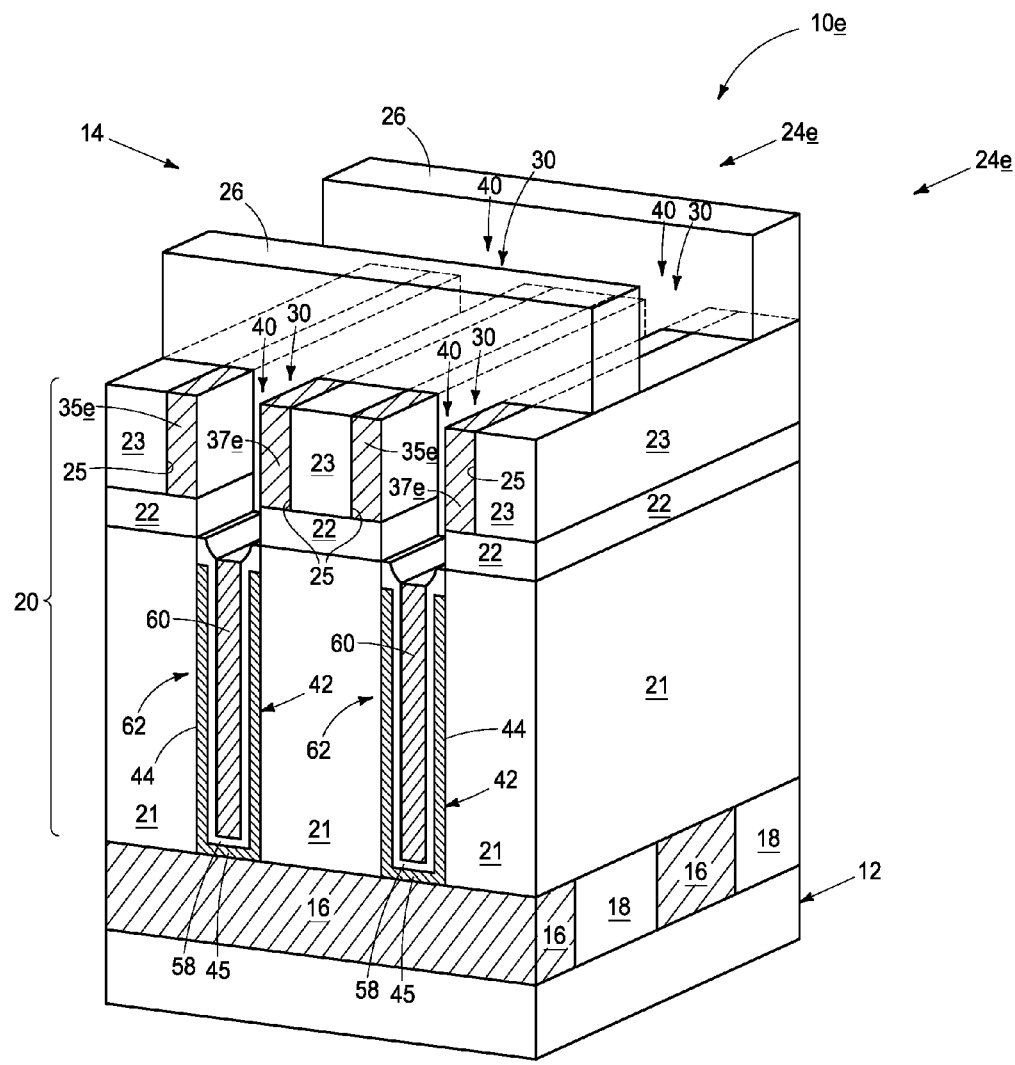
FIG. 35 is a view of the FIG. 33 construction at a processing step subsequent to that shown by FIG. 33.

Referring to FIG. 35, lines 35*e*, 37*e*, material 23, and material 26 have been used as a mask while etching into underlying insulative material 21 to form capacitor openings 42, followed by formation of capacitors 62.

Figure 36:
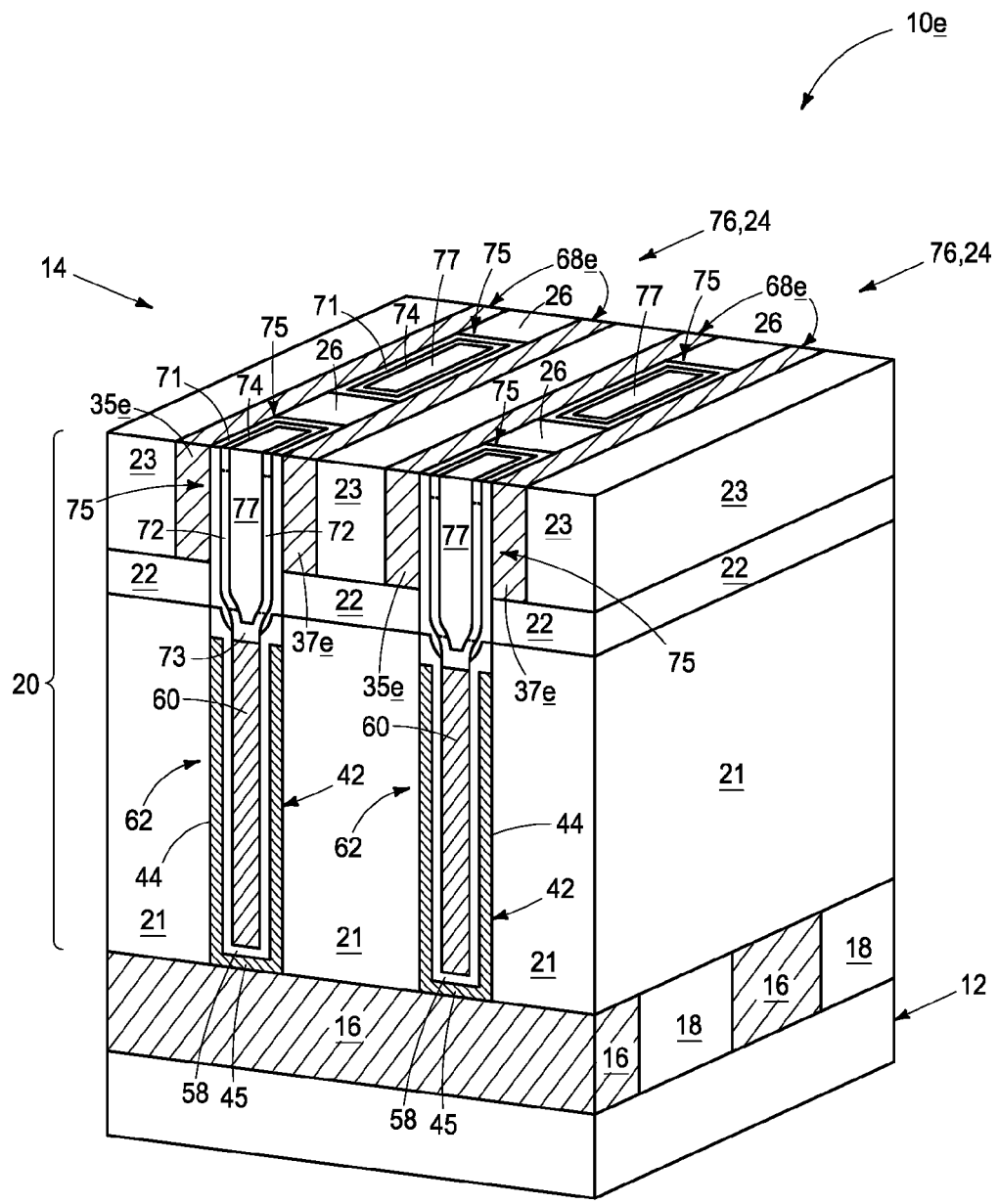
FIG. 36 is a view of the FIG. 35 construction at a processing step subsequent to that shown by FIG. 35.

Referring to FIG. 36, subsequent processing has been conducted analogously to that described above whereby individual pairs of access line walls 35*e* and 37*e* comprise an access line 68*e* of resultant transistors 75.

In one embodiment, the pairs of walls extend into space (e.g., 28) that is longitudinally between the trench openings, and in one embodiment extend from trench opening to trench opening between immediately-longitudinally-adjacent of the trench openings. In one embodiment, masking material 26 is conductive and is directly against the pair of access line walls and remains in a finished circuitry construction. In one embodiment, masking material 26 is insulative or semiconductive and is directly against the pair of access line walls and remains in a finished circuitry construction.

In one embodiment, peripheral sides of the channel openings are formed to be of the same composition circumferentially from top-to-bottom (e.g., FIG. 33 walls 35*e*, 37*e* are of the same composition, and masking material 26 is conductive and of the same composition as walls 35*e*, 37*e*). In one embodiment, peripheral sides of the channel openings are formed to be of different composition along different circumferentially-extending segments, and of the same composition from top-to-bottom within each of the circumferentially-extending segments (e.g., masking material 26 and walls 35*e*, 37*e* in trenches 24*e* each being a different circumferentially-extending segment of peripheral sides of the channel openings, and at least one of such being of different composition from another). In one embodiment, peripheral sides of the channel openings are formed to comprise only two different compositions (e.g., walls 35*e* and 37*e* being of the same composition, and masking material 26 being of different composition to that of walls 35*e*, 37*e*). In one embodiment, peripheral sides of the channel openings are formed to comprise at least two pairs of laterally-opposing circumferentially-extending segments, with individual of the laterally-opposing circumferentially-extending segments in each pair being of the same composition (e.g., walls 35*e*, 37*e* being of the same composition and one pair, masking material 26 on opposing sides being another pair). In one embodiment, the circumferentially-extending segments are formed to alternate in the two different compositions circumferentially about the individual channel openings (e.g., walls 35*e*, 37*e* being of the same composition and masking material 26 being on opposing sides circumferentially between sides formed by masking material 26).

Any other attribute(s) or aspect(s) as described herein and/or shown may be used with respect to the embodiment of FIGS. 30-36.

An embodiment of the invention comprises a memory cell independent of method of manufacture. Such a memory cell comprises a capacitor (e.g., 62) comprising an upwardly-open container shape electrode (e.g., 44). The memory cell also comprises a hollow channel transistor (e.g., 75) above and directly electrically coupled to the capacitor. In one embodiment, the capacitor comprises a laterally-inner electrode (e.g., 60) that is laterally inward of the upwardly-open container shape electrode, with the hollow transistor being directly electrically coupled to the laterally-inner electrode. An embodiment of the invention also encompasses an array of such memory cells. Any other attribute(s) or aspect(s) as described herein and/or shown may be used.

In one embodiment, memory cells of an array individually comprise a capacitor and a transistor, with the array comprising rows of access lines and columns of digit lines. One such embodiment is described with reference to FIG. 21. Such shows individual rows 80 that comprise an access line 68 extending operatively adjacent channels 72 of individual transistors 75 of individual memory cells MC within array 14 and which interconnect transistor 75 in that row. Such also shows columns 81 that individually comprise a digit line 79 above access lines 68, with digit line 79 being electrically coupled to one source/drain region (e.g., 74, and in one embodiment, directly electrically coupled thereto) of individual transistors 75 and which interconnect transistors 75 in that column 81. Capacitors 62 of individual memory cells MC within array 14 individually comprise a laterally-outer electrode (e.g., 44) having an upwardly-open container shape. Capacitors 62 also comprise a laterally-inner electrode (e.g., 60). A capacitor insulator 58 is between laterally-outer electrode 44 and laterally-inner electrode 60. Laterally-inner electrode 44 is electrically coupled (in one embodiment, directly electrically coupled) to the other source/drain region (e.g., 73) of individual transistors 75. Laterally-outer electrode 44 having the upwardly-open container shape is directly against a lower conductor (e.g., 60) that comprises a shared capacitor electrode of multiple capacitors 62 within array 14. In one embodiment and as shown, laterally-outer electrode 44 has a bottom 45 that is directly against lower conductor 16. Any other attribute(s) or aspect(s) as described herein and/or shown may be used.

In one embodiment, lower conductor 16 comprises a series of laterally-spaced conductive lines that are directly electrically coupled together, for example as is shown schematically by a schematic interconnect line 82. Such interconnection may physically occur within and/or outwardly of array area 14. In one embodiment, the conductive lines are angled relative to the access lines. In one embodiment, the conductive lines are parallel to the access lines. In one embodiment, the conductive lines are angled relative the digit lines. In one embodiment, the conductive lines are parallel to the digit lines.

Figure 37:
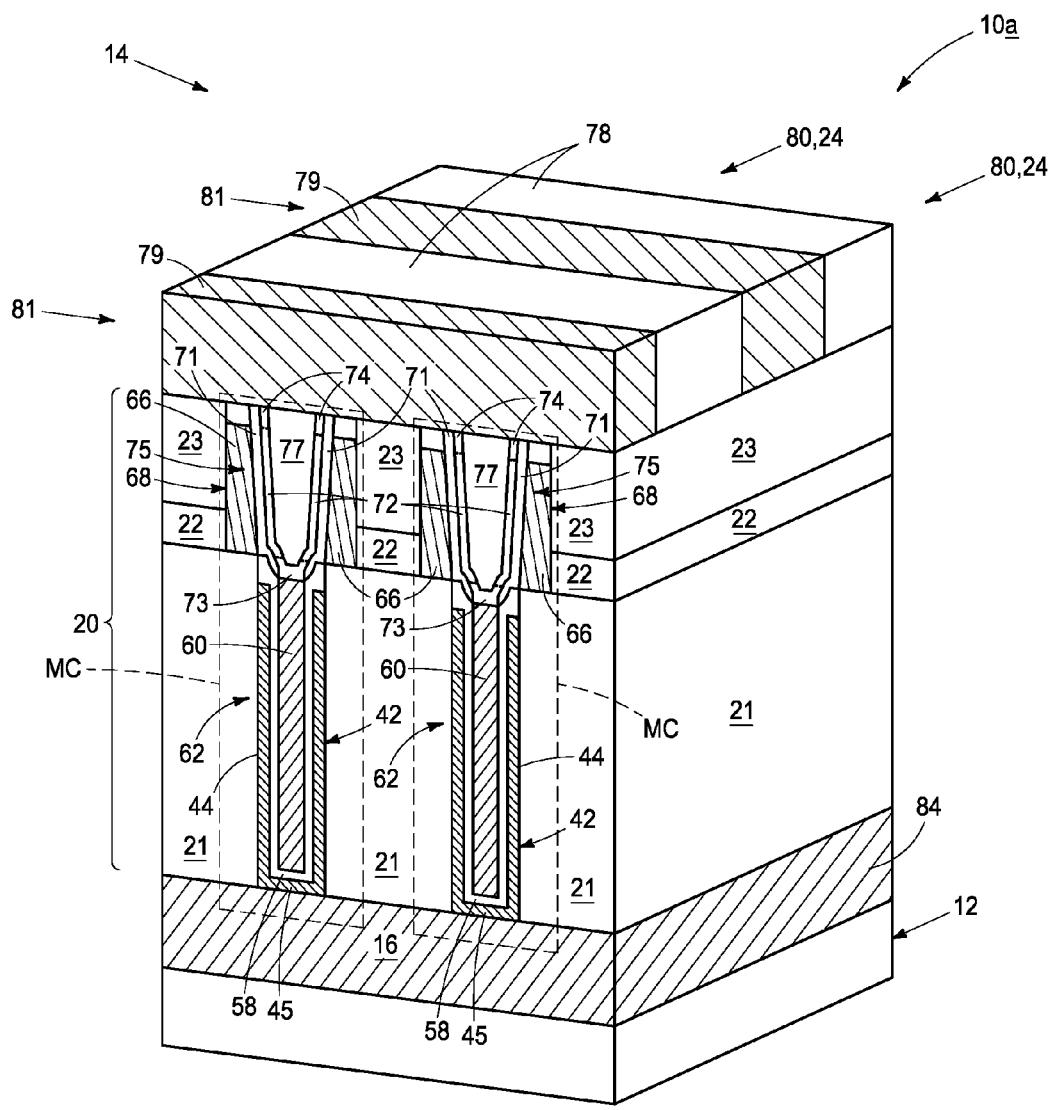
FIG. 37 is a perspective view of a substrate construction in accordance with an embodiment of the invention.

An alternate example construction 10a is shown in FIG. 37 with respect to a construction 10a. Like numerals from the above-described embodiments have been used where appropriate, with some differences being indicated with the suffix "a" or with different numerals. Construction 10a comprises the lower conductor in the form of a conductive plate 84 which in one embodiment is under all of array 14, forming and thereby directly electrically coupling all capacitor electrodes 44 together within array 14. Any other attribute(s) or aspect(s) as described herein and/or shown may be used.

In one embodiment, individual of the channels are hollow channels. In one embodiment, the laterally-outer electrode having the upwardly-open container shape has a bottom that is directly against a lower conductor. In one such embodiment, the lower conductor has an uppermost surface within the array, with the bottom of the laterally-outer electrode being directly against the uppermost surface of the lower electrode. In one embodiment, the digit line is directly electrically coupled to the one source/drain region of the individual transistors and the laterally-inner electrode is directly electrically coupled to the other source/drain region regions of the individual transistors.

In one embodiment, memory cells MC are 1T-1C memory cells, although any other architecture may be employed. 1T-1C memory cells are individually characterized by having only one transistor and only one capacitor and no other/additional operable electronic component (e.g., no other select device, etc.), yet may also include conductive material interconnecting the transistor and capacitor together and the individual memory cell to other components outside of the individual memory cells.

Figure 38:
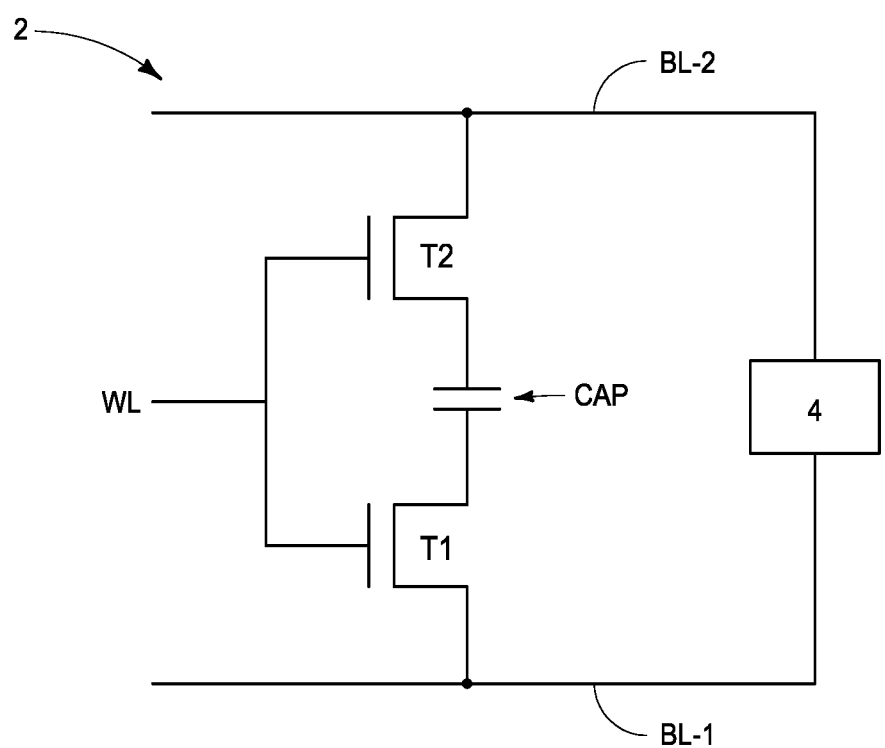
FIG. 38 is a schematic of a two transistor/one capacitor memory (2T/1C) cell in accordance with an embodiment of the invention.

An embodiment of the invention comprises a 2T-1C memory cell, and in one embodiment an array of such memory cells. Referring to FIG. 38, an example 2T-1C memory cell configuration 2 includes two transistors and one capacitor. The two transistors are labeled as T1 and T2, and the capacitor is labeled as CAP. A source/drain region of T1 connects with a first node of the capacitor (CAP), and the other source/drain region of T1 connects with a first comparative bit line (BL-1). A gate of T1 connects with a word line (WL). A source/drain region of T2 connects with a second node of the capacitor (CAP), and the other source/drain region of T2 connects with a second comparative bit line BL-2. A gate of T2 connects with the word line (WL). The comparative bit lines BL-1 and BL-2 extend to circuitry 4 which compares electrical properties (e.g., voltage) of the two to ascertain a memory state of memory cell 2. An advantage of the 2T-1C memory cell is that a memory state may be ascertained by comparing the electrical properties of the two comparative bit lines BL-1 an BL-2 to one another, and accordingly a reference bit line associated with prior art memory (for instance, 1T-1C memory) may be omitted. The 2T-1C configuration of FIG. 38 may be used in DRAM (dynamic random access memory) and/or other types of memory.

Figure 39:
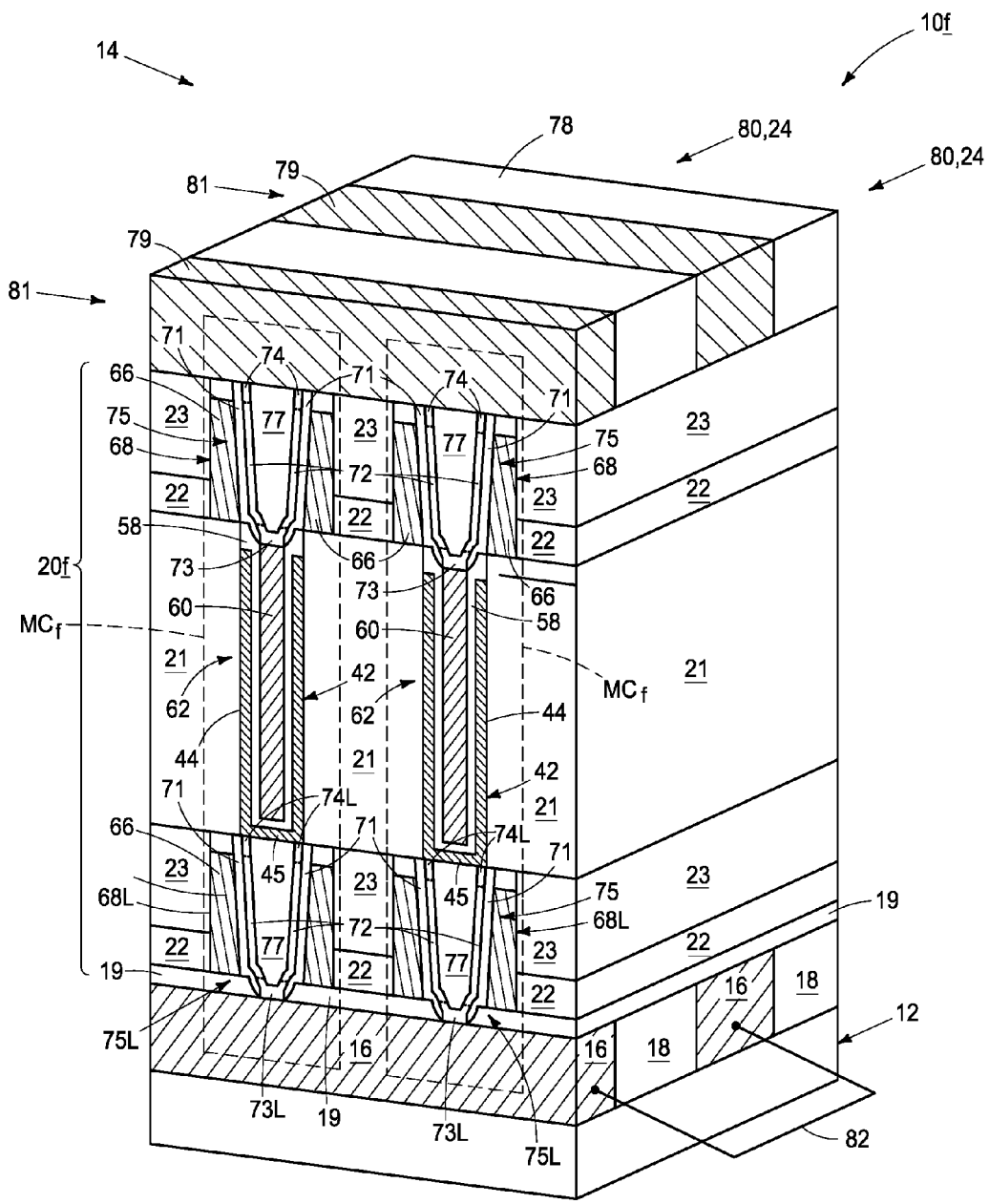
FIG. 39 is a diagrammatic perspective view of a 2T/1C construction in accordance with an embodiment of the invention.

An alternate embodiment construction to that of FIG. 21 that may comprise 2T-1C architecture like that shown in FIG. 38 is shown in FIG. 39. Like numerals from the above-described embodiments have been used where appropriate, with some differences being indicated with the suffix "f". Construction 10f comprises individual memory cells $MC_f$ of 2T-1C architecture and which may be volatile or non-volatile depending on composition of the capacitor insulator. Memory cells $MC_f$ individually comprise a capacitor 62 comprising a laterally-outer electrode 44 having an upwardly-open container shape. Capacitor 62 comprises a laterally-inner electrode 60 and a capacitor insulator 58 between laterally-outer electrode 44 and laterally-inner electrode 60. Memory cell $MC_f$ comprises an upper elevationally-extending transistor 75 that has a lower source/drain region 73 thereof electrically coupled (in one embodiment directly electrically coupled) to laterally-inner electrode 60. In one embodiment, the upper transistor is a hollow channel transistor. Memory cell $MC_f$ comprises a lower elevationally-extending transistor 75L that has an upper source/drain region 74L thereof electrically coupled (in one embodiment directly electrically coupled) to laterally-outer electrode 44 having the upwardly-open container shape. In one embodiment, the lower transistor is a hollow channel transistor. Lower transistor 75L may be fabricated using any existing or yet-to-be-developed method, including that disclosed herein with respect to fabrication of transistor 75. Materials of transistor 75L, including dielectric material there-about, are designated with the suffix "L" and which may be the same as those described above for transistors 75 without the suffix "L". Access lines 68 and 68L may be electrically coupled together in accordance with the FIG. 38 schematic. A line 79 and a line 16 may comprise comparative bit lines BL-1 and BL-2 and extend to circuitry 4. Insulative material 20f is shown comprising an insulator 19 separating access lines 68L from lines 16.

Any other attribute(s) or aspect(s) as described herein and/or shown may be used with respect to the FIG. 39 embodiment.

The above-described processing and figures show fabrication of, for example, one tier (which is generic to "deck" and "level") of an array of memory cells. Additional such tiers may be provided or fabricated above or below the one tier depicted in the figures. Alternately, only a single such tier may be fabricated.

Regardless, a method embodiment of the invention comprises forming a tier of an array of memory cells within an array area. The memory cells will individually comprise a capacitor and an elevationally-extending transistor thereabove. The method comprises using two, and only two, sacrificial masking steps within the array area of the tier in forming the transistors and the capacitors of the memory cells. In the context of this document, a "sacrificial masking step" is a patterning technique using masking material that is patterned over substrate material combined with subsequent removal (e.g., by etching) of substrate material that is uncovered by the masking material, and with at least an uppermost portion of the masking material being sacrificial and thereby ultimately being removed from being over the substrate. The masking material may include a lowest portion that remains as part of the finished circuitry construction. Alternately, all of the sacrificial masking material may be completely removed. In accordance with on embodiment, each of the two masking steps within the array area of the tier with respect to material that is elevationally inward of masking material removes only dielectric material. For example, and by way of example only, an above such processing described with respect to FIGS. 1-21 is such a method where materials 21, 22, 23, and 26 are dielectric.

Specifically, FIGS. 1-3 is one masking step, and FIGS. 4-9 is another masking step. In the above-described example embodiments and in accordance with the one embodiment of this paragraph, there are no other sacrificial masking steps within array area 14 of the depicted tier in forming the individual memory cells. Such may be facilitated by forming circuit components in a self-aligned manner. In this document, "self-aligned" means a technique whereby at least a lateral surface of a structure is defined by deposition of material against a sidewall of a previously patterned structure. Any other attribute(s) or aspect(s) as described herein and/or shown may be used.

An embodiment of the invention comprises a method of forming a tier of an array of memory cells within an array area, where the memory cells will individually comprise a capacitor and an elevationally-extending transistor there-above. The method comprises using two, and only two, sacrificial masking steps within the array area of the tier in forming the transistors and the capacitors of the memory cells. One of the two masking steps within the array area of the tier with respect to material that is elevationally inward of masking material removes only dielectric material. The other of the two masking steps within the array area of the tier with respect to material that is elevationally inward of masking material removes dielectric material and conductive material. For example, and by way of example only, an above such processing described with respect to FIGS. 1-21 is such a method where materials 21, 22, and 23 are dielectric and at least one of materials 26 and 36 are conductive. Specifically, FIGS. 1-3 is the one masking step (dielectric material only is etched), and FIGS. 4-9 is the other masking step (dielectric material and conductive material are etched). In one embodiment, the other is conducted after the one.

CONCLUSION

In some embodiments, a method of forming an array of capacitors and access transistors there-above comprises forming access transistor trenches partially into insulative material. The trenches individually comprise longitudinally-spaced masked portions and longitudinally-spaced openings in the trenches longitudinally between the masked portions. The trench openings have walls therein extending longitudinally in and along the individual trench openings against laterally-opposing sides of the trenches. At least some of the insulative material that is under the trench openings is removed through bases of the trench openings between the walls and the masked portions to form individual capacitor openings in the insulative material that is lower than the walls. Individual capacitors are formed in the individual capacitor openings. A line of access transistors is formed in the individual trenches. The line of access transistors electrically couples to the individual capacitors that are along that line.

In some embodiments, a method of forming a tier of an array of memory cells within an array area, with the memory cells individually comprising a capacitor and an elevationally-extending transistor there-above, comprises using two, and only two, sacrificial masking steps within the array area of the tier in forming the transistors and the capacitors of the memory cells. In each of the two masking steps within the array area of the tier with respect to material that is elevationally inward of masking material, only dielectric material is removed.

In some embodiments, a method of forming a tier of an array of memory cells within an array area, with the memory cells individually comprising a capacitor and an elevationally-extending transistor there-above, comprises using two, and only two, sacrificial masking steps within the array area of the tier in forming the transistors and the capacitors of the memory cells. In one of the two masking steps within the array area of the tier with respect to material that is elevationally inward of masking material, only dielectric material is removed. In the other of the two masking steps within the array area of the tier with respect to material that is elevationally inward of masking material, dielectric material and conductive material is removed.

In some embodiments, a method of forming an array of capacitors and access transistors there-above comprises forming access transistor trenches partially into insulative material. The trenches individually comprise longitudinally-spaced masked portions and longitudinally-spaced openings in the trenches longitudinally between the masked portions. After forming the trench openings, encircling walls are formed against peripheral sides of the individual trench openings. At least some of the insulative material that is under the trench openings is removed through bases of the trench openings radially inward of the encircling walls to form individual capacitor openings in the insulative material that is lower than the walls. Individual capacitors are formed in the individual capacitor openings. A line of access transistors is formed in the individual trenches. The line of access transistors electrically couples to the individual capacitors that are along that line.

In some embodiments, a method of forming an array of capacitors and access transistors there-above comprises forming access transistor trenches partially into insulative material. The trenches individually comprise longitudinally-spaced masking material and longitudinally-spaced openings in the trenches longitudinally between the masking material. After forming the trench openings, sacrificial encircling walls are formed against peripheral sides of the individual trench openings to form individual mask openings within the individual trench openings. At least some of the insulative material that is under the mask openings is removed through bases of the mask openings radially inward of the encircling walls to form individual capacitor openings in the insulative material that is lower than the walls. Individual capacitors are formed in the individual capacitor openings. After forming the capacitors, the mask openings are plugged with sacrificial material. The sacrificial encircling walls are removed to form longitudinally-spaced sacrificial pillars comprising the sacrificial material within the trenches. A conductive material is formed in and along the trenches about the sacrificial material pillars to form an access line in the individual trenches. The sacrificial pillars are removed to form channel openings in the individual access lines in the trenches. Gate insulator and channel material is formed in the channel openings. The access line, the gate insulator, and the channel material are formed to comprise a line of access transistors in the individual trenches. The line of access transistors electrically couples to the individual capacitors that are along that line of access transistors.

In some embodiments, a method of forming an array of capacitors and access transistors there-above comprises forming access transistor trenches partially into insulative material. The trenches individually comprising longitudinally-spaced masking material and longitudinally-spaced openings in the trenches longitudinally between the masking material. After forming the trench openings, conductive encircling walls are formed against peripheral sides of the individual trench openings to form individual channel openings within the individual trench openings. At least some of the insulative material that is under the channel openings is removed through bases of the channel openings radially inward of the encircling walls to form individual capacitor openings in the insulative material that is lower than the walls. Individual capacitors are formed in the individual capacitor openings. Gate insulator and channel material are formed in the individual channel openings. The conductive encircling walls comprise an access line in the individual trenches. The access line, the gate insulator, and the channel material are formed to comprise a line of access transistors in the individual trenches. The line of access transistors electrically couples to the individual capacitors that are along that line of access transistors.

In some embodiments, a method of forming an array of capacitors and access transistors there-above comprises forming access transistor trenches partially into insulative material. The trenches individually comprise longitudinally-spaced conductive masking material and longitudinally-spaced openings in the trenches longitudinally between the conductive masking material. After forming the trench openings, encircling walls are formed against peripheral sides of the individual trench openings to form individual mask openings within the individual trench openings. At least some of the insulative material that is under the mask openings is removed through bases of the mask openings radially inward of the encircling walls to form individual capacitor openings in the insulative material that is lower than the walls. Individual capacitors are formed in the individual capacitor openings. A line of access transistors is formed in the individual trenches. The line of access transistors electrically couples to the individual capacitors that are along that line. The conductive masking material comprising an access line of the line of the access transistors in the individual trenches.

In some embodiments, a method of forming an array of capacitors and access transistors there-above comprises forming access transistor trenches partially into insulative material. A pair of access line walls is formed in individual of the trenches. The access line walls extend longitudinally in and along the individual trenches against laterally-opposing sides of the trenches. Longitudinally-spaced masked portions are formed in the trenches and longitudinally-spaced channel openings are formed in the trenches longitudinally between the masked portions. At least some of the insulative material that is under the channel openings is removed through bases of the channel openings between the walls and the masked portions to form individual capacitor openings in the insulative material that is lower than the walls. Individual capacitors are formed in the individual capacitor openings. Gate insulator and channel material are formed in the channel openings. The pair of access line walls, the gate insulator, and the channel material are formed to comprise a line of access transistors in the individual trenches. The line of access transistors electrically couples to the individual capacitors that are along that line of access transistors.

In some embodiments, a memory cell comprises a capacitor comprising an upwardly-open container shape electrode. A hollow channel transistor is above and directly electrically coupled to the capacitor.

In some embodiments, an array of memory cells individually comprising a capacitor and a transistor, with the array comprising rows of access lines and columns of digit lines, comprises individual of the rows comprising an access line extending operatively adjacent channels of individual transistors of individual memory cells within the array and interconnecting the transistors in that row. Individual of the columns comprise a digit line above the access lines. The digit line is electrically coupled to one source/drain region of the individual transistors and interconnects the transistors in that column. Capacitors of the individual memory cells within the array individually comprise a laterally-outer electrode having an upwardly-open container shape and a laterally-inner electrode. A capacitor insulator is between the laterally-outer electrode and the laterally-inner electrode. The laterally-inner electrode is electrically coupled to the other source/drain region of the individual transistors. The laterally-outer electrode having the upwardly-open container shape is directly against a lower conductor that comprises a shared capacitor electrode of multiple of the capacitors within the array.

In some embodiments, a 2T-1C memory cell comprises a capacitor comprising a laterally-outer electrode having an upwardly-open container shape and a laterally-inner electrode. A capacitor insulator is between the laterally-outer electrode and the laterally-inner electrode. A lower elevationally-extending transistor has an upper source/drain region thereof electrically coupled to the laterally-outer electrode having the upwardly-open container shape. An upper elevationally-extending transistor has a lower source/drain region thereof electrically coupled to the laterally-inner electrode.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of capacitors and access transistors there-above, comprising:
   forming access transistor trenches partially into insulative material, the trenches individually comprising longitudinally-spaced masked portions and longitudinally-spaced openings in the trenches longitudinally between the masked portions, the trench openings having walls therein extending longitudinally in and along the individual trench openings against laterally-opposing sides of the trenches;
   removing at least some of the insulative material that is under the trench openings through bases of the trench openings between the walls and the masked portions to form individual capacitor openings in the insulative material that is lower than the walls;
   forming individual capacitors in the individual capacitor openings; and
   forming a line of access transistors in the individual trenches, the line of access transistors electrically coupling to the individual capacitors that are along that line.

2. The method of claim 1 comprising forming the walls to be of different composition from that of the insulative material that is laterally-adjacent the trenches.

3. The method of claim 2 comprising using the insulative material that is laterally-adjacent the trenches, the walls, and the masked portions as a mask during said removing.

4. The method of claim 1 wherein the masked portions are masked with conductive masking material.

5. The method of claim 1 wherein the masked portions are masked with insulative masking material.

6. The method of claim 1 wherein the walls are conductive.

7. The method of claim 1 wherein the walls are insulative.

8. The method of claim 1 wherein the walls are semiconductive.

9. The method of claim 1 wherein the walls do not extend into space that is longitudinally between the trench openings.

10. The method of claim 1 wherein the walls also extend into space that is longitudinally between the trench openings.

11. The method of claim 10 wherein the walls extend longitudinally into the space from trench opening-to-trench opening between immediately-longitudinally-adjacent of the trench openings.

12. The method of claim 1 comprising forming the access transistors to comprise hollow channels.

13. The method of claim 1 comprising forming the individual capacitors to comprise a laterally-outer container shape capacitor electrode and which is directly electrically coupled to a capacitor electrode that is shared by multiple capacitors within the array.

14. A method of forming a tier of an array of memory cells within an array area, the memory cells individually comprising a capacitor and an elevationally-extending transistor there-above, the method comprising using two, and only two, sacrificial masking steps within the array area of the tier in forming the transistors and the capacitors of the memory cells, each of the two masking steps within the array area of the tier with respect to material that is elevationally inward of masking material removing only dielectric material.

15. A method of forming a tier of an array of memory cells within an array area, the memory cells individually comprising a capacitor and an elevationally-extending transistor there-above, the method comprising using two, and only two, sacrificial masking steps within the array area of the tier in forming the transistors and the capacitors of the memory cells, one of the two masking steps within the array area of the tier with respect to material that is elevationally inward of masking material removing only dielectric material, the other of the two masking steps within the array area of the tier with respect to material that is elevationally inward of masking material removing dielectric material and conductive material.

16. A method of forming an array of capacitors and access transistors there-above, comprising:
forming access transistor trenches partially into insulative material, the trenches individually comprising longitudinally-spaced masked portions and longitudinally-spaced openings in the trenches longitudinally between the masked portions;
after forming the trench openings, forming encircling walls against peripheral sides of the individual trench openings;
removing at least some of the insulative material that is under the trench openings through bases of the trench openings radially inward of the encircling walls to form individual capacitor openings in the insulative material that is lower than the walls;
forming individual capacitors in the individual capacitor openings; and
forming a line of access transistors in the individual trenches, the line of access transistors electrically coupling to the individual capacitors that are along that line.

17. A method of forming an array of capacitors and access transistors there-above, comprising:
forming access transistor trenches partially into insulative material, the trenches individually comprising longitudinally-spaced masking material and longitudinally-spaced openings in the trenches longitudinally between the masking material;
after forming the trench openings, forming sacrificial encircling walls against peripheral sides of the individual trench openings to form individual mask openings within the individual trench openings;
removing at least some of the insulative material that is under the mask openings through bases of the mask openings radially inward of the encircling walls to form individual capacitor openings in the insulative material that is lower than the walls;
forming individual capacitors in the individual capacitor openings;
after forming the capacitors, plugging the mask openings with sacrificial material;
removing the sacrificial encircling walls to form longitudinally-spaced sacrificial pillars comprising the sacrificial material within the trenches;
forming conductive material in and along the trenches about the sacrificial material pillars to form an access line in the individual trenches;
removing the sacrificial pillars to form channel openings in the individual access lines in the trenches; and
forming gate insulator and channel material in the channel openings;
the access line, the gate insulator, and the channel material being formed to comprise a line of access transistors in the individual trenches, the line of access transistors electrically coupling to the individual capacitors that are along that line of access transistors.

18. A method of forming an array of capacitors and access transistors there-above, comprising:
forming access transistor trenches partially into insulative material, the trenches individually comprising longitudinally-spaced masking material and longitudinally-spaced openings in the trenches longitudinally between the masking material;
after forming the trench openings, forming conductive encircling walls against peripheral sides of the individual trench openings to form individual channel openings within the individual trench openings;
removing at least some of the insulative material that is under the channel openings through bases of the channel openings radially inward of the encircling walls to form individual capacitor openings in the insulative material that is lower than the walls;
forming individual capacitors in the individual capacitor openings; and
forming gate insulator and channel material in the individual channel openings, the conductive encircling walls comprising an access line in the individual trenches; the access line, the gate insulator, and the channel material being formed to comprise a line of access transistors in the individual trenches, the line of access transistors electrically coupling to the individual capacitors that are along that line of access transistors.

19. A method of forming an array of capacitors and access transistors there-above, comprising:
forming access transistor trenches partially into insulative material, the trenches individually comprising longitudinally-spaced conductive masking material and longitudinally-spaced openings in the trenches longitudinally between the conductive masking material;
after forming the trench openings, forming encircling walls against peripheral sides of the individual trench openings to form individual mask openings within the individual trench openings;
removing at least some of the insulative material that is under the mask openings through bases of the mask openings radially inward of the encircling walls to form individual capacitor openings in the insulative material that is lower than the walls;

forming individual capacitors in the individual capacitor openings; and forming a line of access transistors in the individual trenches, the line of access transistors electrically coupling to the individual capacitors that are along that line, the conductive masking material comprising an access line of the line of the access transistors in the individual trenches.

20. A method of forming an array of capacitors and access transistors there-above, comprising:

forming access transistor trenches partially into insulative material;

forming a pair of access line walls in individual of the trenches, the access line walls extending longitudinally in and along the individual trenches against laterally-opposing sides of the trenches;

forming longitudinally-spaced masked portions and longitudinally-spaced channel openings in the trenches longitudinally between the masked portions;

removing at least some of the insulative material that is under the channel openings through bases of the channel openings between the walls and the masked portions to form individual capacitor openings in the insulative material that is lower than the walls;

forming individual capacitors in the individual capacitor openings; and forming gate insulator and channel material in the channel openings;

the pair of access line walls, the gate insulator, and the channel material being formed to comprise a line of access transistors in the individual trenches, the line of access transistors electrically coupling to the individual capacitors that are along that line of access transistors.

21. A memory cell comprising:

a capacitor comprising an upwardly-open container shape electrode; and a hollow channel transistor above and directly electrically coupled to the capacitor.

22. An array of memory cells individually comprising a capacitor and a transistor, the array comprising rows of access lines and columns of digit lines, comprising:

individual of the rows comprising an access line extending operatively adjacent channels of individual transistors of individual memory cells within the array and interconnecting the transistors in that row;

individual of the columns comprising a digit line above the access lines, the digit line being electrically coupled to one source/drain region of the individual transistors and interconnecting the transistors in that column;

capacitors of the individual memory cells within the array individually comprising:

a laterally-outer electrode having an upwardly-open container shape;

a laterally-inner electrode;

a capacitor insulator between the laterally-outer electrode and the laterally-inner electrode;

the laterally-inner electrode being electrically coupled to the other source/drain region of the individual transistors; and the laterally-outer electrode having the upwardly-open container shape being directly against a lower conductor that comprises a shared capacitor electrode of multiple of the capacitors within the array.

23. A memory cell having a total of only two transistors and a total of only one capacitor, comprising:

a capacitor comprising a laterally-outer electrode having an upwardly-open container shape;

a laterally-inner electrode a capacitor insulator between the laterally-outer electrode and the laterally-inner electrode;

a lower elevationally-extending transistor having an upper source/drain region thereof electrically coupled to the laterally-outer electrode having the upwardly-open container shape; and an upper elevationally-extending transistor having a lower source/drain region thereof electrically coupled to the laterally-inner electrode.

24. The method of claim 15 wherein the other is after the one.

25. The method of claim 16 comprising forming the encircling walls to be conductive.

26. The method of claim 16 comprising forming the encircling walls to be insulative.

27. The method of claim 16 comprising forming the encircling walls to be semiconductive.

28. The method of claim 17 comprising removing the masking material from the trenches such that the longitudinally-spaced sacrificial pillars have no solid material between them longitudinally along the individual trenches.

29. The method of claim 17 wherein the masking material is conductive.

30. The method of claim 17 wherein the masking material is insulative.

31. The method of claim 17 wherein the masking material is semiconductive.

32. The method of claim 17 comprising forming the access transistors to comprise hollow channels.

33. The method of claim 17 comprising forming the individual capacitors to comprise an upwardly-open container shape capacitor electrode and a laterally-inner electrode that is laterally inward of the upwardly-open container shape capacitor electrode, the line of access transistors directly electrically coupling to the individual of the laterally-inner electrodes along that line of access transistors.

34. The method of claim 33 comprising forming the individual laterally-inner electrodes to be, from side-to-side, entirely solid from top-to-bottom in horizontal cross-section.

35. The method of claim 18 wherein the masking material is conductive and at least some of which remains to comprise the access line.

36. The method of claim 18 wherein no portion of the masking material remains to comprise the access line.

37. The method of claim 36 comprising removing all of the masking material from the individual trenches.

38. The method of claim 19 comprising forming the encircling walls to be conductive and comprise the access line.

39. The method of claim 19 comprising forming the encircling walls to be insulative.

40. The method of claim 39 comprising removing at least some of the encircling walls and replacing the at least some of the encircling walls with conductive material that comprises the access line.

41. The method of claim 40 comprising removing all of the encircling walls and replacing the encircling walls with the conductive material.

42. The method of claim 19 comprising forming the encircling walls to be semiconductive.

43. The method of claim 20 wherein the masked portions are masked with conductive masking material.

44. The method of claim 43 wherein the conductive masking material is directly against the pair of access line walls and remains in a finished circuitry construction.

45. The method of claim 20 wherein the masked portions are masked with insulative masking material.

46. The method of claim 45 wherein the insulative masking material is directly against the pair of access line walls and remains in a finished circuitry construction.

47. The method of claim 20 comprising forming peripheral sides of the channel openings to be of the same composition circumferentially from top-to-bottom.

48. The method of claim 20 comprising forming the peripheral sides of the channel openings to be of different composition along different circumferentially-extending segments, and of the same composition from top-to-bottom within each of the circumferentially-extending segments.

49. The method of claim 48 comprising forming the peripheral sides of the channel openings to comprise only two different compositions.

50. The method of claim 49 comprising at least two pairs of laterally-opposing circumferentially-extending segments, individual of the laterally-opposing circumferentially-extending segments in each pair being of the same composition.

51. The method of claim 49 comprising forming the circumferentially-extending segments to alternate in the two different compositions circumferentially about the individual channel openings.

52. The memory cell of claim 21 wherein the capacitor comprises a laterally-inner electrode that is laterally inward of the upwardly-open container shape electrode, the laterally-inner electrode being, from side-to-side, entirely solid from top-to-bottom in horizontal cross-section.

53. The memory cell of claim 21 wherein the capacitor comprises a laterally-inner electrode that is laterally inward of the upwardly-open container shape electrode, the hollow transistor being directly electrically coupled with the laterally-inner electrode.

54. The memory cell of claim 53 wherein the capacitor comprises a laterally-inner electrode that is laterally inward of the upwardly-open container shape electrode, the laterally-inner electrode being, from side-to-side, entirely solid from top-to-bottom in horizontal cross-section.

55. An array of the memory cells of claim 21.

56. The memory cell of claim 21 wherein the memory cell has a total of only one transistor and a total of only one capacitor.

57. The memory cell of claim 21 wherein the memory cell has more than a total of one transistor or has more than a total of one capacitor.

58. The memory cell of claim 57 wherein the memory cell has a total of only two transistors and a total of only one capacitor.

59. The array of claim 22 wherein individual of the channels are hollow channels.

60. The array of claim 22 wherein the laterally-outer electrode having the upwardly-open container shape has a bottom that is directly against the lower conductor.

61. The array of claim 60 wherein the lower conductor has an uppermost surface within the array, the bottom of the laterally-outer electrode being directly against the uppermost surface of the lower electrode.

62. The array of claim 22 wherein the lower conductor comprises a conductive plate under all of the array.

63. The array of claim 22 wherein the lower conductor comprises a series of laterally-spaced conductive lines that are directly electrically coupled together.

64. The array of claim 63 wherein the conductive lines are angled relative the access lines.

65. The array of claim 63 wherein the conductive lines are parallel to the access lines.

66. The array of claim 63 wherein the conductive lines are angled relative the digit lines.

67. The array of claim 63 wherein the conductive lines are parallel to the digit lines.

68. The array of claim 22 wherein,
the digit line is directly electrically coupled to the one source/drain region of the individual transistors; and
the laterally-inner electrode is directly electrically coupled to the other source/drain region of the individual transistors.

69. The array of claim 22 wherein the memory cells individually have a total of only one transistor and a total of only one capacitor.

70. The memory cell of claim 22 wherein the memory cells individually have a total of only two transistors and a total of only one capacitor.

71. The memory cell of claim 23 wherein the lower transistor is a hollow channel transistor.

72. The memory cell of claim 23 wherein the upper transistor is a hollow channel transistor.

73. The memory cell of claim 23 wherein the lower transistor is a hollow channel transistor and the upper transistor is a hollow channel transistor.

74. The memory cell of claim 23 wherein the upper source/drain region of the lower elevationally-extending transistor is directly electrically coupled to the laterally-outer electrode having the upwardly-open container shape.

75. The memory cell of claim 23 wherein the lower source/drain region of the upper elevationally-extending transistor is directly electrically coupled to the laterally-inner electrode.

76. The memory cell of claim 23 wherein,
the upper source/drain region of the lower elevationally-extending transistor is directly electrically coupled to the laterally-outer electrode having the upwardly-open container shape; and
the lower source/drain region of the upper elevationally-extending transistor is directly electrically coupled to the laterally-inner electrode.

\* \* \* \* \*